(12) United States Patent  
Ciolfi et al.

(10) Patent No.: US 8,768,658 B1  
(45) Date of Patent: Jul. 1, 2014

(54) CONFIGURABLE ENABLEMENT OF OPERATIONS ASSOCIATED WITH STATE ENABLED SYSTEMS IN A GRAPHICAL ENVIRONMENT

(75) Inventors: John Ciolfi, Wellesley, MA (US); Darel Allen Linebarger, Southborough, MA (US); Brian K. Ogilvie, Holliston, MA (US)

(73) Assignee: The Mathworks, Inc., Natick, MA (US)

( * ) Notice: Subject to any disclaimer, the term of this patent is extended or adjusted under 35 U.S.C. 154(b) by 1072 days.

(21) Appl. No.: 12/262,749

(22) Filed: Oct. 31, 2008

Related U.S. Application Data

(60) Provisional application No. 61/009,497, filed on Dec. 28, 2007.

(51) Int. Cl.
```
G06F 7/60        (2006.01)
G06F 17/10       (2006.01)
G06F 17/50       (2006.01)
```

(52) U.S. Cl.  
CPC .......... *G06F 17/5009* (2013.01); *G06F 17/504* (2013.01)  
USPC .............................................................. 703/2

(58) Field of Classification Search  
CPC .............. G06F 17/5009; G06F 17/504; G06F 2217/16; G06F 2217/74  
USPC ................................................. 703/2, 13–15  
See application file for complete search history.

(56) References Cited

U.S. PATENT DOCUMENTS

| | | | |
|---|---|---|---|
| 6,816,827 B1 * | 11/2004 | Xia et al. | 703/15 |
| 7,840,913 B1 | 11/2010 | Agrawal et al. | |
| 2002/0078255 A1 * | 6/2002 | Narayan | 709/316 |
| 2005/0216248 A1 * | 9/2005 | Ciolfi et al. | 703/22 |

OTHER PUBLICATIONS

Stateflow and Stateflow Coder User's Guide Version 5—The MathWorks, Jan. 2003.*  
The MathWorks, Inc., "Simulink® 6—Using Simulink®", Version 6.6, Mar. 2007, 1052 pages.  
The MathWorks, Inc., "Signal Processing Blockset—For Use with Simulink®", User's Guide Version 6, Jun. 2004, 1463 pages.

* cited by examiner

*Primary Examiner* — Aniss Chad  
(74) *Attorney, Agent, or Firm* — Harrity & Harrity, LLP

(57) ABSTRACT

Exemplary embodiments allow configurable execution of operations associated with a state enabled system in a graphical modeling or graphical programming environment. In an embodiment, a state enabled system may be identified in a graphical model, or a graphical program, or both. The state enabled system may be associated with a first operation and a second operation, and may include instructions to execute the first and second operations. The state enabled system may be configured to always execute the first operation regardless of an enabling condition. The state enabled system may also be configured to prevent an execution of the second operation unless the enabling condition is satisfied.

19 Claims, 21 Drawing Sheets

CONFIGURABLE ENABLEMENT OF OPERATIONS ASSOCIATED WITH STATE ENABLED SYSTEMS IN A GRAPHICAL ENVIRONMENT

RELATED APPLICATIONS

The present application claims priority to U.S. Provisional Application No. 61/009,497 filed on Dec. 28, 2007, the entire content of which is incorporated by reference.

BACKGROUND

Graphical modeling and graphical programming environments allow users to design, simulate and analyze graphical structures that represent systems, such as dynamic systems. A graphical structure representing a system may implement time-dependent or event-dependent mathematical relationships among its inputs, states and outputs. Blocks, described in more detail below, are one type of graphical structure. The blocks may describe computations performed on application-specific computational hardware, such as a computer, microcontroller, Field Programmable Gate Array (FPGA), or custom hardware. The blocks may be used to produce deployable software systems, or to produce descriptions of hardware systems that can mimic the behavior of either the entire model or portions of the model (referred to herein as 'code generation'). The term 'block' will hereafter be used generally to refer to graphical structures.

Graphical structures may be part of a block diagram model which may contain blocks and lines. The lines in a block diagram model may carry information, describe dependencies, or define relationships between the blocks. The lines may also have operations or mathematics associated with them. The blocks in a block diagram model may be dynamic system elements that define operations (generally referred to as block methods), represent mathematical equations, and/or contain state information. Methods defined by a block may include output operations and update operations. Output operations may calculate an output of a block, and update operations may update a state of a block.

A block in a block diagram model may be enabled when an enabling condition is satisfied, or disabled when the enabling condition is not satisfied. Conventionally, when a block is enabled, both the output and update operations associated with the block are executed to produce an output and to update a state of the block, respectively. In contrast, when a block is disabled, neither the output operation nor the update operation associated with the block is executed.

SUMMARY

In one aspect, one or more computer-readable media holding executable instructions are disclosed. The instructions include instructions for identifying an executable state enabled system including instructions for a first operation and a second operation. The instructions also include instructions for configuring the state enabled system to always execute the first operation regardless of an enabling condition, and to prevent an execution of the second operation unless the enabling condition is satisfied. The instructions further include instructions for executing the first and second operations.

In another aspect, a computer-implemented method is disclosed. The method includes identifying an executable state enabled system including instructions for a first operation and a second operation. The method also includes configuring the state enabled system to always execute the first operation regardless of an enabling condition, and to prevent an execution of the second operation unless the enabling condition is satisfied. The method further includes executing the first and second operations.

In yet another aspect, a computer system is disclosed for configuring operations associated with an executable state enabled system. The computer system includes a processor configured to implement a first user interface and a second user interface. The first user interface renders the state enabled system on a display, and executes operations, the state enabled system holding instructions for the operations. The second user configures at least one of the operations for conditional execution, and identifies a condition to be satisfied before the at least one of the operations is executed. The computer system also includes a storage for storing the first and second user interfaces.

In still another aspect, one or more computer-readable media storing executable instructions is disclosed. The instructions include instructions for identifying an executable state enabled system including instructions for an output operation and a state update operation. The instructions also include instructions for conditioning the state enabled system to always execute the output operation regardless of an occurrence of a condition, and to prevent an execution of the state update operation unless the condition occurs. The instructions further include instructions for executing the output and state update operations.

BRIEF DESCRIPTION OF THE DRAWINGS

The accompanying drawings, which are incorporated herein and constitute a part of this specification, illustrate one or more embodiments of the invention and, together with the description, explain the invention. In the drawings.

DETAILED DESCRIPTION

Figure 1A:
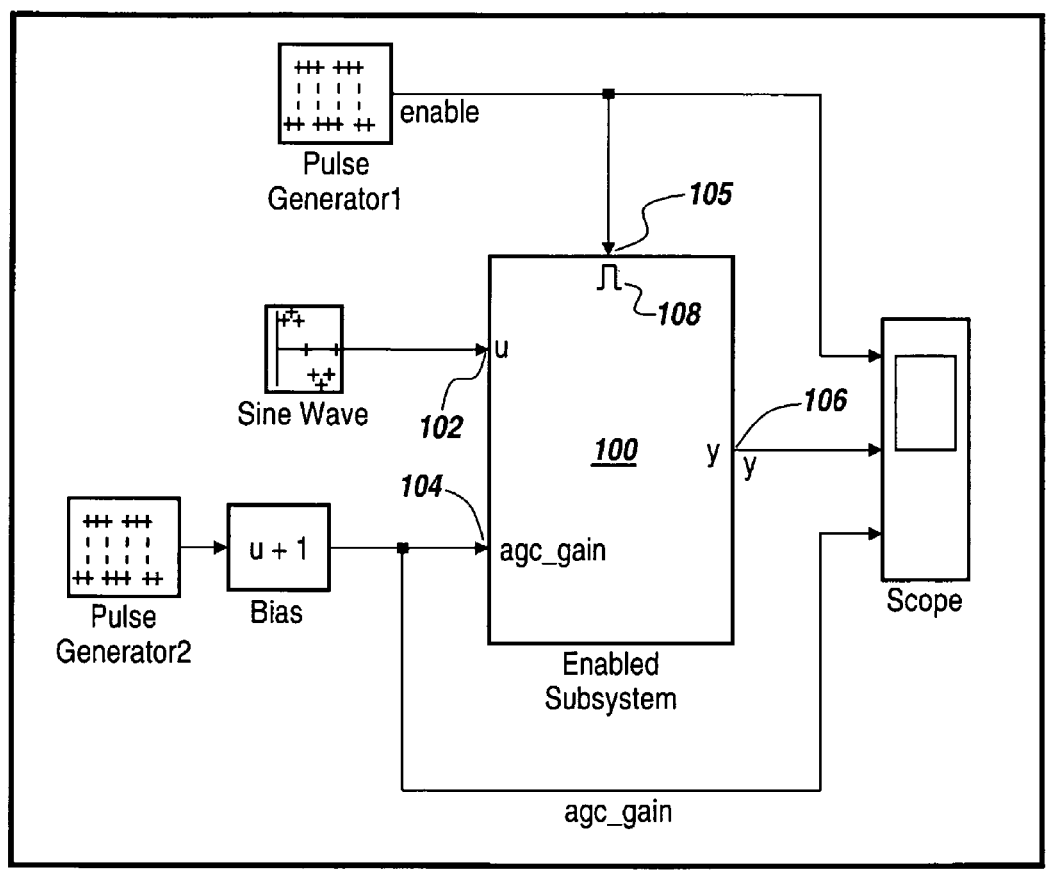
FIG. 1A illustrates a model with an Enabled Subsystem having output and state update operations associated therewith and configured to function as a conventional enabled system (prior art)

Exemplary embodiments allow configuration of the execution of operations associated with a graphical structure, so that the execution of operations may be controlled during an execution of the graphical structure. A 'graphical structure,' as used herein, may be an entity in a program or model, such as an element, multiple elements, a subsystem, or a system. Graphical structures may be part of different types of programs or models, such as block diagram models, data flow models, or state charts.

An exemplary embodiment of a configurable graphical structure is referred to herein as a state enabled system. A 'state enabled system' is a graphical structure that may be configured so that its output operations are executed independent of whether the graphical structure is 'active' or 'enabled,' while its update operations are executed only when the graphical structure is 'active' or 'enabled.' The 'active' or 'enabled' state of a graphical structure may be based on the 'on' status of an enabling condition or an enabling signal.

The behavior of a state enabled system differs from that of a conventional enabled system (which is described in more detail below) in that the output operations of a state enabled system continue to execute when the system itself is not executing. As a result, a state enabled system accurately captures system behavior and allows efficient generation of hardware description language (HDL) code from the graphical representation of the system.

I. Blocks

Exemplary embodiments enable execution of operations associated with blocks implemented in a graphical modeling or programming environment. Exemplary embodiments also allow configuring execution of the operations based on the active or inactive status of the associated blocks.

(a) Block Operations

A block may have one or more associated signals and/or one or more associated states. A state, e.g. state $x(t)$, may represent internal data associated with a block. In some embodiments, a state may be an internal notion of blocks. Signals, e.g. the input signal to the block, $u(t)$, and the output signal of the block, $y(t)$, may be thought of as persistent values that are updated when a block is executed. Signals in a time-based block diagram represent time-vary quantities and, while they are a function of states in general, they are not block states themselves. The same is true in other graphical modeling environments. For example, signals in data flow models can represent flow of information and data dependencies, the signals being equivalent to variables in a textual programming language. In addition, the blocks in data flow models can have internal states that persist between block invocations.

A block in a block diagram model may implement one or more operations during its execution. These operations may include one or more output operations, update operations, and/or derivative operations. An 'output operation' may generate an output of the block, updating the output signal, $y(t)$. An 'update operation' may update a state of the block, $x(t)$, which represents internal data associated with the block. A 'derivative operation' may compute the derivative of a state of the block, $\dot{x}(t)$. A block may execute any number of additional operations in addition to the aforementioned exemplary operations, e.g. an 'initialize operation' that may initialize a state of the block, a 'Jacobian operation' for linearization, etc.

Blocks operations may be implemented in the model as methods or functions, and may receive any number of parameters as arguments. More formally, mathematical representations of the exemplary block operations, in a time-based block diagram modeling environment, such as Simulink, are set forth as follows:

input signal: $u(t)$
state: $x(t)$
output signal: $y(t)$
Outputs: $y(t)=f(t,x(t),u(t))$
Update: $x_d(t)=g(t,x(t),u(t))$
Derivatives: $\dot{x}_c(t)=h(t,x(t),u(t))$
where $x(t)=[x_d(t);x_c(t)]$ A block may be executed when it has a sample hit. Execution of a block may involve executing the block operations by solving the equations defined by the operations. An output operation is executed to generate an output of the block which updates the block's output signals, $y(t)$, while an update operation is executed to update a state of the block.

Such block execution is exemplified by a block modeling a unit delay of a scalar signal. This unit delay block is executed, upon each sample hit, to delay a scalar signal by one time step. The block has a state representing the prior value of the input signal. At the beginning of execution of the block, the state of the block is initialized with an initial condition parameter obtained from a dialog box. During execution of the block, its output operation copies the state to the output signal. The update operation then copies the input signal value to the current state.

(b) Simulation Loop

In one embodiment, a block diagram model may be simulated by sorting the blocks in the model, creating block method execution lists (i.e. sorted lists of block methods that identify the order in which the block methods are to execute), and running the execution lists in a simulation or execution loop. The simulation loop may execute the operations associated with the blocks in the block diagram model, e.g. the output, update and derivative operations discussed above.

A simulation loop may be performed in a single iteration or in multiple iterations. If the loop is performed in multiple iterations, time (t) representing the current time as time advances in the simulation or execution of the model; t may be incremented by a step size (h) in iteration of the simulation or execution loop.

More formally, a simulation loop may be represented as follows:

---

SimLoop:
    Outputs: $y(t) = f(t, x(t), u(t))$
    Update: $x_d(t) = g(t, x(t), u(t))$
    Integrate:
    Outputs: $y(t + k * h) = f(t + k * h, x(t + k * h), u(t + k * h))$
        Derivatives: $\dot{x}_c(t + k * h) = h(t + k * h, x(t + k * h), u(t + k * h))$
        $x_c(t+k*h) = \int \dot{x}_c$
    $t = t + h$
EndLoop

---

The above representation of a simulation loop is reflective of the semantics of a time-based block diagram. At the end of each iteration of the simulation loop, time (t) is incremented by a step size (h). In addition to the output, update and derivative operations, an integration operation may be provided in the simulation loop to compute the states ($x_c$) of the blocks from the derivatives ($\dot{x}_c$). The number of calls to the output and derivative operations during integration is dependent on the type of solver being used. Additional run-time operations may be placed in the simulation loop to ensure the block diagram model executes as expected. For example, Jacobian operations may be added to aid in the integration or to perform linearization.

Exemplary embodiments may allow the execution of the operations associated with a block to be configurable. Execution of all, some, or none of the operations may be controlled during an execution of a graphical model or graphical program that contains the block. In some instances, execution of an operation may be configured so that the operation executes only when a condition is satisfied. In other instances, execution of the operation may be configured so that the operation executes only when a condition is not satisfied. In yet other instances, the execution of the operation may be configured to occur independently of a condition.

In one embodiment referred to as a 'state enabled system,' the operations of a block may be configured so that an output operation is executed independent of a condition, while an update operation only executes when a condition is satisfied. That is, output operations in a state enabled system continue to execute when the system itself is not executing. State enabled systems are useful in accurately modeling multi-purpose processors and microcontrollers, because such conditional execution is closely aligned with the behavior of multi-purpose processors and the teachings of system theory (e.g. control system and signal processing fields).

The semantics of state enabled systems are defined by the following scheme implemented in a simulation loop:
SimLoop:
  Output Operations:
    Compute outputs y(t), as defined by the output equations of the constituent graphical structures, i.e. run the output methods of all graphical structures within the state enabled system.
  Update Operations:
    If enabled, update states, $x_d(t)$, i.e. run update methods. The states may be updated using discrete update methods.
  Integration Operations:
    If enabled, integrate derivatives (i.e. run output, zero crossing, derivative methods) to compute the continuous states, $x_c(t)$ using integration of the derivative signals.

Exemplary embodiments may allow configurable enablement of operations in hierarchical or non-hierarchical systems. Exemplary embodiments may be implemented in different graphical modeling domains, each domain providing domain-specific semantics that dictate what the models mean and how the models can be executed or translated to an execution environment. Some graphical modeling domains may support the notion of hierarchy. For example, the Simulink® modeling environment, version 6.6, from The MathWorks, Inc., supports several forms of hierarchy, e.g. Atomic Subsystems, Enabled Subsystems, Triggered Subsystems, Trigger and Enabled Subsystems, Function-Call Subsystems, Action Subsystems, and hierarchy through the notion of Model Reference. In one embodiment, all the hierarchical systems may be conditionally executed. In another embodiment, only a subset of these hierarchical systems may be conditionally executed.

A hierarchical system may contain layers of blocks to facilitate containment, separation and/or nesting. The context of each layer of hierarchy may be defined so that each layer has its own execution context. For example, a state enabled system S may be contained within a larger state enabled system L. According to the execution scheme of state enabled systems, the output operations may be left running for all layers of the hierarchy regardless of the enabled status of the layers, i.e. for both state enabled systems S and L. If the larger state enabled system L is disabled, then the state update operations of both systems S and L may not be performed. On the other hand, if the larger state enabled system L is enabled, then the state update operation of system L may be performed, but the state update operation of system S may be performed only if the state enabled system S is also enabled.

Exemplary embodiments may provide one or more user interfaces to allow a user to configure blocks to act as state enabled systems. To this end, a user may establish conditions that must be satisfied before the operations associated with the blocks may execute.

Exemplary embodiments may also provide one or more visual identifiers associated with a block. A visual identifier may identify to a user that the block is configured to control the execution of one or more operations. For example, the visual identifier may identify that the block is configured to execute the output operation independent of a condition and to prevent the update operation from executing unless the condition is satisfied. However, in some embodiments, the visual identifiers may be excluded from the model.

Exemplary embodiments may generate code using, for example, a hardware description language (HDL), from a graphical model or graphical program, or a portion thereof that includes a block configured to conditionally execute operations associated with the block. The block may provide semantics that correspond directly to an implementation of the generated code so code may be generated more efficiently, e.g. using fewer steps to translate the block into the generated code.

II. A Conventional Enabled System

In contrast to the state enabled system of exemplary embodiments, a conventional enabled system is generally configured such that its associated operations, e.g. both output and update operations, execute only when the system is enabled. Such conventional enabled systems may capture system output behavior inaccurately, because, in some applications, the output operations should be executed regardless of the enable status of the system. In addition, direct translation of such systems to custom hardware results in inefficiencies due to the system semantics.

Conventional ways of improving the accuracy of system output behavior include holding the output of the system using a storage component. When the model is translated to hardware, this necessitates adding storage elements to the generated hardware (e.g. HDL) for the enabled system, which reduces the efficiency with which the system is executed or simulated. The extra storage elements also tend to increase the amount of chip area used in the hardware, hardware production costs, etc. Furthermore, the additional storage elements tend to introduce delays in the hardware by increasing the time it takes for signals to pass through the system.

FIG. 1A illustrates a model from Simulink 6.6 containing a Enabled Subsystem having output and state update operations associated therewith and configured to function as a conventional enabled system (prior art). An Enabled Subsystem 100 is provided in a block diagram model that models a system. The Enabled Subsystem 100 may be configured to perform any number of tasks. In this particular example, blocks have been added to the contents of the Enabled Subsystem 100 to implement an Adaptive Gain Control (AGC). The primary goal of AGC circuits is to maintain a constant signal level at the output (y) by multiplying the agc_gain signal value by the input signal value (u) to eliminate variations in the input signal (u). Feedback and more elaborate mathematics may be used in the computation of the agc_gain signal as well as the enabling signal. The input signal (u) may be connected to blocks representing the physical signal that is having the gain controlled, and the gain-controlled output signal (y) may be connected to other blocks that represent the physical processing of the signal. The exemplary embodiment of FIG. 1A uses simple source blocks to show the behavior of conventional enabled systems.

The subsystem 100 includes input ports 102, 104 and 105, an output port 106, and a visual identifier 108. The input ports 102 and 104 may receive information, e.g. in the form of input signals, from blocks that may be connected to the subsystem 100. Signals, e.g. the signals at input ports 102,104, and 105, can be thought of as persistent values that have values at all points in time and are updated when the source blocks of the signals executes. In this example, the input port 102 source signal is from a sine wave generator block modeling a sine wave generator, and the input port 104 source signal is from a biased signal from a pulse generator block modeling a pulse generator. The input port 105 source signal specifies an enable condition, e.g. in the form of an enable signal, relating to a condition from another pulse generator block. The condition may control an execution of operations associated with the subsystem 100.

The output 106 of the subsystem 100 may generate a signal, e.g. in the form of an output signal, for display on a scope block modeling a signal scope, e.g. an oscilloscope.

The visual identifier 108 may identify to a user that an execution of operations associated with the subsystem 100 may be conditioned based on a specified configuration.

Figure 1B:
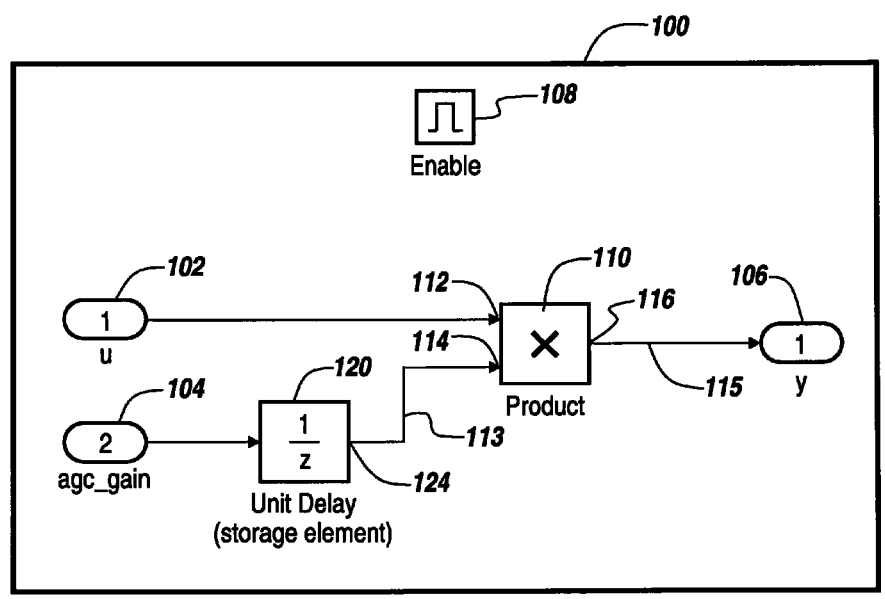
FIG. 1B illustrates a sublevel view of the Enabled Subsystem of FIG. 1A (prior art)

In this example, the subsystem 100 represents has a hierarchical structure of graphical structures. The visualization of the subsystem 100 in FIG. 1A may represent the root or top level of the subsystem or the contents of another system. A user may descend into the hierarchy of the subsystem 100 to view its contents. FIG. 1B depicts such a sublevel view of the contents of the subsystem 100 upon descending into the hierarchical structure of the subsystem 100 (prior art).

The sublevel of the subsystem 100 illustrated in FIG. 1B includes a Product block 110 modeling a multiplication function and a Unit Delay block 120 modeling a storage element that delays its input one time step by holding the input in a state. The blocks 110 and 120 each perform one or more operations when executed. During execution, the Product block 110 performs an output operation by computing the product of two inputs, and the Unit Delay block 120 performs an output operation wherein it copies its state to the output ($y(t)=x_d(t)$). This output of the Unit Delay block is used as the second input of the Product block 110. The Unit Delay block 120 also performs an update operation which consists of copying its input to its internal state $x_d(t+h)$. The sublevel of the subsystem 100 also includes an Enable Port block 108 of FIG. 1B which provides the visual identifier 108 of FIG. 1A on or about the subsystem 100.

The connections and operations associated with the blocks in subsystem 100 will now be described in more detail. The Product block 110 has an input port 112, an input port 114 and an output port 116. The input port 112 of the Product block 110 is connected to the output port of an Inport block 102 which provides the Sine Wave signal. The other input port 114 of the Product block 110 is connected to an output port 124 of the Unit Delay block 120 via a signal line 113. The Product block 110 thus has a sine wave signal and the output of the Unit Delay block 120 as its two inputs. The output port 116 of the Product block 110 is connected to the input port of an Outport block 106 via the output signal line 115. The output generated by the Product block 110 at the Outport block 106 may be displayed in a scope block (shown in FIG. 1A) external to the subsystem 100.

The input port of the Unit Delay block 120 is connected to the output port of an Inport block 104 which provides the agc_gain signal. The Unit Delay block 120 thus has the agc_gain signal as its input. The output port 124 of the Unit Delay block 120 is connected to the input port 114 of the Product block 110 via a signal line 113.

The Product block 110 executes an output operation to generate an output signal y(t) at the output port 116 which is the product of an input signal u(t) at the input port 112 and an input signal at input port 114. The Unit Delay block 120 executes an output operation, in which the Unit Delay state, x(t), is copied to its output at the output port 124. The Unit Delay block 120 also executes an update operation which copies the input signal from the Inport block 104 to the Unit Delay state, x(t+h). These operations may be executed within a simulation loop.

The signals in the subsystem 100 may be of any type. In the specific example illustrated in FIGS. 1A and 1B, the enable signal is a periodic rectangular function with a maximum value above 1 and a minimum value of 0. The input signal, u(t), at the input port 102 of the subsystem block 100 is a sine wave. The agc_gain input signal, at the input port 104 is a periodic rectangular function with a maximum of 2 and a minimum value of 1.

The subsystem 100 is executed in a simulation loop, wherein the execution time, t, is incremented by a step size, h, at the end of each iteration of the loop. The execution of the output operations of the Product block 110 and the Unit Delay block 120 result in the overall output operation (1) of the subsystem 100. Execution of the state update operation of the Unit Delay block 120 results in the update operation (2) of the subsystem 100.

Output Operation:

$$y(t)=u(t)*x(t) \quad (1)$$

Update Operation:

$$x(t+h)=\text{agc\_gain}(t) \quad (2)$$

The processing of time-based block diagrams for simulation or execution involves collecting the run-time methods, i.e. equations, of each set of blocks into model equations. In this example of a conventional enabled system, the model equations for the state update operation and the output operation are executed only when the enable signal at the input port 105 is greater than zero, i.e. when the subsystem 100 is active or enabled.

The simulation loop for the model of FIG. 1A is set forth as follows:

```
Initialize:
    x(t) = 0; // Initial condition of the Unit Delay
SimLoop:
    Outputs:
        u(t) = SineWave(t);
        agc_gain(t) = pulse2(t) + 1;
        if (pulse1(t) > 0) {
            y(t) = EnabledSubsystemOutput(t,u,agc_gain);
        }
        Scope(pulse1(t),y(t),agc_gain(t));
    Update:
        if (pulse1(t) > 0) {
            x(t+h) = EnabledSubsystemUpdate(t,x,u);
        }
        t = t + h
EndLoop
EnableSubsystemOutput:
    y(t) = u(t)*x(t)
EnabledSubsystemUpdate
    x(t+h) = agc_gain(t) ;
```

Figure 2:
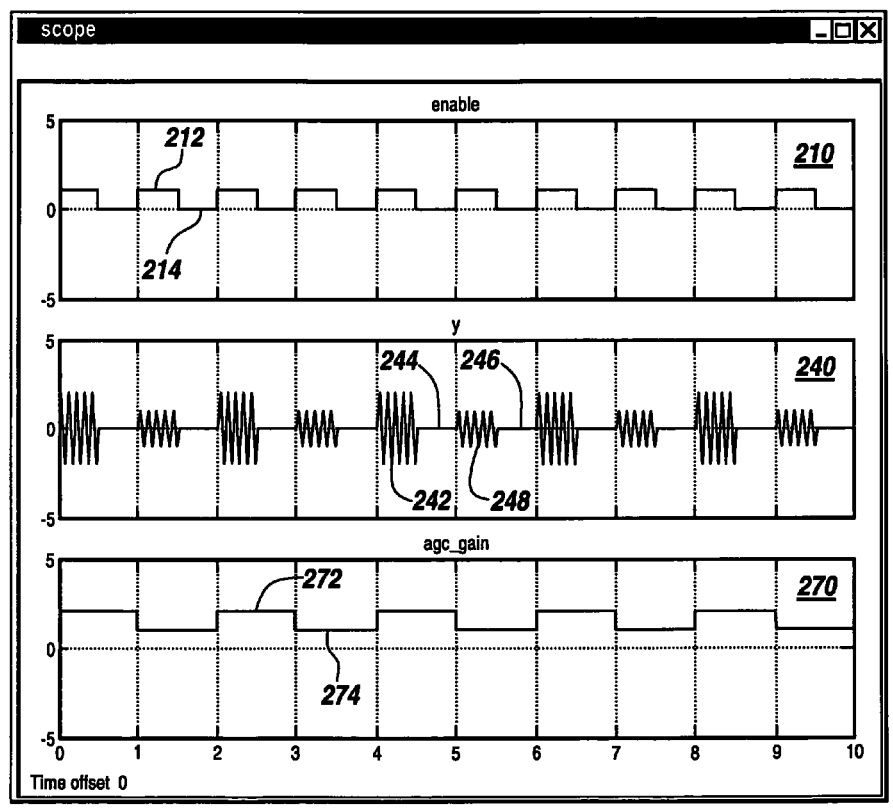
FIG. 2 illustrates the output behavior of the Enabled Subsystem of FIGS. 1A and 1B configured to function as a conventional enabled system (prior art)

FIG. 2 depicts the output behavior of the conventional enabled subsystem of FIGS. 1A and 1B as shown by the scope block of FIG. 1A (prior art). The enable signal alternates between one (212) and zero (214), and is displayed in enable view 210. The y output signal is displayed in y output view 240. The agc_gain input signal alternates between a maximum value (272) and a minimum value (274), and is displayed in agc_gain input view 270.

In a conventional enabled system, when the subsystem 100 is not active or enabled, the contents of the subsystem do not execute and the subsystem output is set to some value, e.g. reset to a default value like zero or to the previous output. As depicted in the y output view 240 of FIG. 2, the y output signal is equal to a sine wave input signal multiplied by the agc_gain input signal (242, 248) when the subsystem is enabled, i.e. when the enable signal is greater than zero. The y output signal is set to zero (244, 246) when the subsystem is not enabled, i.e. the enable signal is zero, because the y output signal is set to zero when the enabled subsystem is disabled.

For applications, such as models that are to be realized in hardware (e.g. using a hardware description language, HDL), such a conventional enabled system may not accurately capture the behavior of the system output. In addition, synthesizing HDL code from these model abstractions may result in inefficiencies due to the semantics of conventional enabled and conditionally-executed subsystems.

In the previous example of a conventional subsystem, the processing of the Product block of FIG. 1B only occurred when the system was enabled. For this AGC example, to improve correctness of the system output and hardware efficiency, the enable signal should apply only to the state update operation, and not to the output operation of the subsystem. Conventional ways of applying the enable signal only to the state update operation include reorganizing a graphical structure so that an enabled subsystem in the graphical structure only includes components performing update operations, i.e. excludes components performing output operations. Components performing output operations are provided outside the enabled system.

Figure 3A:
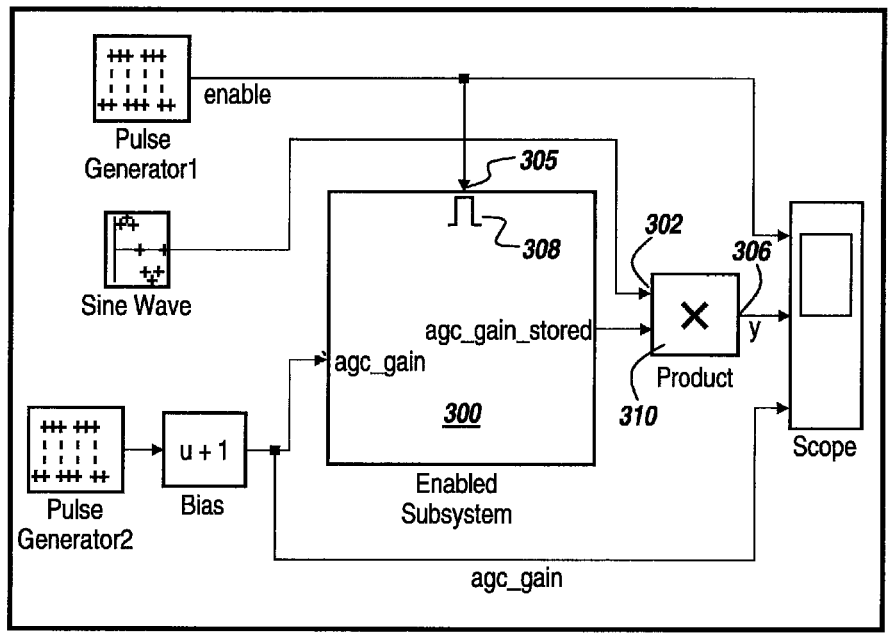
FIG. 3A illustrates the model with an Enabled Subsystem of FIGS. 1A and 1B modified to obtain a desired output behavior (prior art)
Figure 3B:
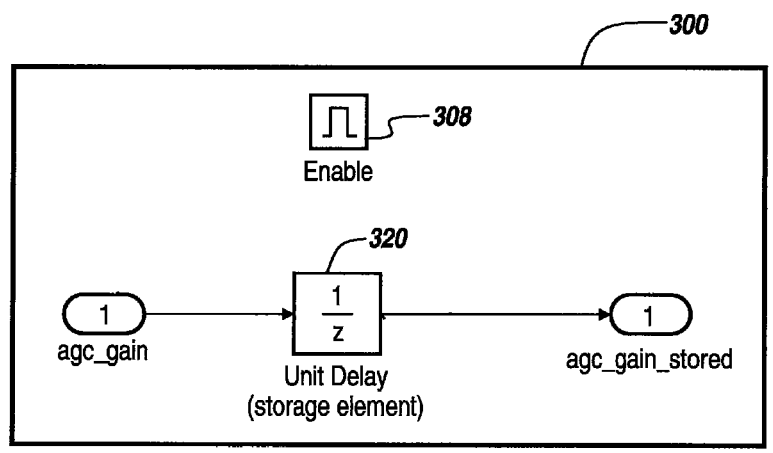
FIG. 3B illustrates a sublevel view of the Enabled Subsystem of FIG. 3A (prior art)

FIGS. 3A and 3B (prior art) depict such a conventional modification of the conventional enabled subsystem of FIGS. 1A and 1B. In the modified conventional model of FIGS. 3A and 3B, the Unit Delay block 320 performing both output and update operations is provided inside the Enabled Subsystem 300, so that its output and update operations are conditioned on the enable signal 308 received at input port 305. However, the Product block 310 performing an output operation is provided outside the enabled subsystem 300, so that the output operation is not conditioned on the enable signal 308.

Figure 3C:
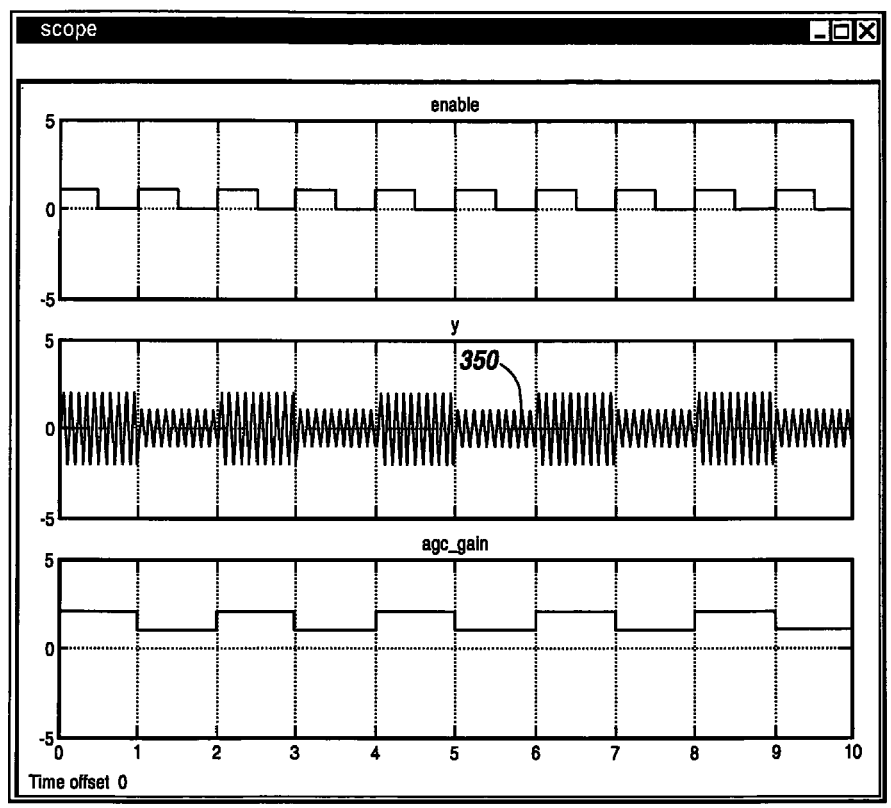
FIG. 3C illustrates the output behavior of the model of FIGS. 3A and 3B (prior art)

As a result of this modification of the AGC model, the unit delay output and update operations are executed only when the Enabled Subsystem is enabled, i.e. the enable signal connected at input port 305 is greater than zero. In contrast, the output operation of the Product block is executed every time step such that the output is calculated even when the Enabled Subsystem is disabled and for an automatic gain controller, i.e. even when the enable signal is less than or equal to zero. The resulting output behavior is shown in FIG. 3C corresponding to the Scope block of FIG. 3A. The output, y(t) 350, continues to change, i.e. the output operation continues to execute when the enabled subsystem is disabled.

The output of the AGC model of FIG. 3, in contrast to the output of FIG. 1 shown in FIG. 2, is desirable from an application standpoint for accurate modeling of an AGC controller. In particular, the gain controller executes, as shown by the signal y 350, when the Enabled Subsystem (performing gain adaption) is disabled.

Figure 4A:
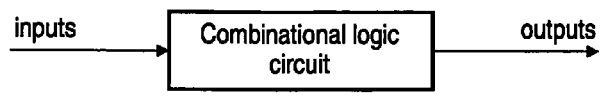
FIG. 4A illustrates a combinational/combinatorial logic circuit.
Figure 4B:
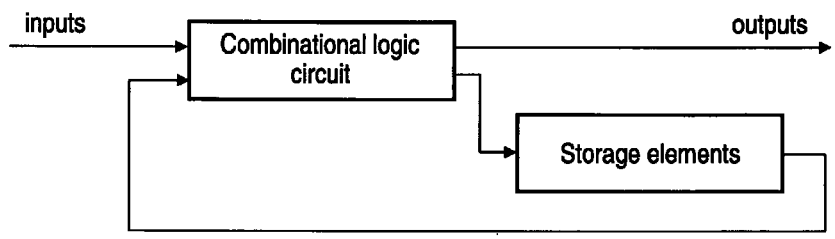
FIG. 4B illustrates a sequential logic circuit.

Hardware implementation of the conventional modification of subsystem 300 will now be described. Hardware can include combinatorial logic circuits and/or sequential logic circuits. FIGS. 4A and 4B illustrate a combinatorial logic circuit and a sequential logic circuit, respectively. In combinatorial logic circuits, the outputs at any instant of time can be dependent upon the inputs present at that time. In sequential logic circuits, the outputs are both a function of the inputs and the state of the storage (memory) elements. The state of the storage elements is, in turn, a function of previous inputs.

A simulation environment such as the Simulink® modeling environment, version 6.6, may provides a memory location for each signal. The memory locations represent time varying quantities that are read or written by the blocks connected to the signals. The simulator is responsible for updating the values of the signals by solving the equations defined by the blocks. The equations may be solved by running the output, update, derivative, etc., run-time methods associated with the blocks. A sample time dictates when, in time, the run-time methods should be executed.

In an actual hardware-base system, such as an ASIC or FPGA or discrete-logic, only the storage elements (e.g. registers or flip-flops or, more formally, storage elements) hold their values, and the value of an interconnecting signal depends on what is driving that signal. If the signal is driven directly by a storage element, then its value is held until the storage element is updated (i.e. clocked by a rising or falling edge of a clock signal). If the signal is not driven directly by a storage element, then the circuit element that drives that signal typically performs continuous calculations of new results whenever the inputs to it change. For example, an adder with two inputs and one output produces an updated output value when any of its inputs change after a circuit delay.

In an exemplary embodiment, a sequential circuit may be constructed to map a conditionally executed subsystem with states to hardware. This can be viewed as taking the output and state update equations of the system and realizing the equations using combinatorial logic and storage elements (a sequential circuit). A sequential logic circuit generally includes a clock pulse or other enabling signal for the storage elements. There may be no such signal for the combinatorial logic circuits. As such, additional logic is needed to ensure that the semantics of the conditionally executed subsystem are met.

Figure 5:
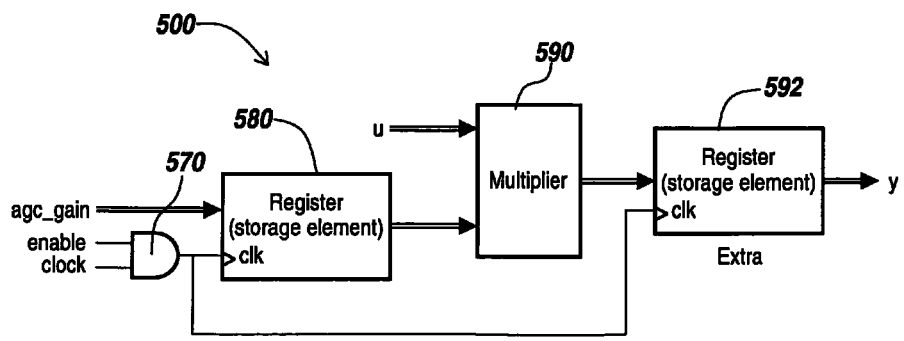
FIG. 5 illustrates a block diagram of an exemplary hardware circuit for the modified version of the Enabled Subsystem of FIG. 1A (prior art)

FIG. 5 depicts a block diagram of an exemplary hardware circuit 500 for the implementation of the conventional Enabled Subsystem of FIGS. 1A and 1B.

The hardware circuit 500 includes a storage element 580, e.g. an n-bit register, an AND gate 570, a multiplier 590, and an second storage element 592. In this hardware circuit, the second storage element 592 is introduced to match the 'hold' behavior of the Enabled Subsystem of FIGS. 1A and 1B as shown in FIG. 2. In general, a hold element would need to be added to every output signal of a conventional Enabled Subsystem. This includes outputs connected to the Outport blocks, such as 'y,' and any other form of outputs, such as Simulink's Goto/From outputs or Simulink's monitored/test pointed signals.

However, additional storage elements at the Enabled Subsystem outputs, like the storage element 592 of FIG. 5, introduce inefficiencies in the system. These storage elements will increase the amount of chip area needed and hardware production costs. The storage elements also tend to introduce delays in the hardware by increasing the time it takes for signals to pass through the system. This can affect the clock rate at which the system will run or prevent the design from meeting its goals.

One means of matching the semantics of traditional enabled systems is using the enable+clock signal to clock the register 580 to hold the output is one means by which one can match the semantics of conventional enabled systems. Another means is to use a hardware mux to switch between the multiplier output and the latched multiplier output (saved in a register). Thus, there are several different means by which one can realize hardware to match the traditional enabled systems by adding additional circuitry to the hardware. However, regardless of the specific realization, the additional circuitry is not desired because it increases cost and/or prevents the system from meeting its design goals.

In contrast to the models depicted in FIGS. 1A and 1B which do not necessarily match desired system behavior, the modified AGC controller of FIGS. 3A and 3B meets the desired system output behavior. The model of FIGS. 3A and 3B, however, requires storage elements (or 'extra') hardware at the output of the Enabled System. The corresponding hardware circuit for the Enabled Subsystem of FIGS. 3A and 3B would be similar to hardware circuit 500 of FIG. 5 except the product (multiplier) circuitry would not be present.

Furthermore, the modified conventional graphical structure of FIGS. 3A and 3B suffers from a lack of modularity. It is desirable to group the Product and Unit Delay blocks into one subsystem so that the Enabled Subsystem can be treated as a single entity, e.g. copied to other models. Moreover, some complicated graphical structures, e.g. the least mean square (LMS) filter block in the Signal Processing Blockset from The MathWorks, Inc. perform both the computation of outputs and the update of internal storage elements (states). Graphical separating the output from the update aspects of the model is technically challenging and leads to loss of model readability.

To address the above deficiencies in the conventional modification technique of FIGS. 1 and 3, exemplary embodiments provide state enabled systems in which an enable signal is applied only to the state update operations and not to the output operations of the systems.

III. A First Example of a State Enabled System

In contrast to conventional methods of adding extra storage elements to the hardware to improve system output behavior, exemplary embodiments provide a state enabled system in which the enable condition or signal is applied only to the state update operations and not to the output operations. Update operations are executed when the system is enabled or active, i.e. when an enable signal is greater than zero. In contrast, output operations are executed continuously so that the output is calculated even when the system is disabled or inactive, i.e. independent of the enable signal value.

This allows exemplary embodiments to capture the correct behavior of the subsystem, and to preserve system modularity by grouping the blocks of the state enabled system into one subsystem. To make the generated HDL code more efficient, exemplary embodiments allow mapping of the subsystem onto sequential logic circuits without the need for additional logic to enable/disable the combinatorial logic circuit.

Figure 6A:
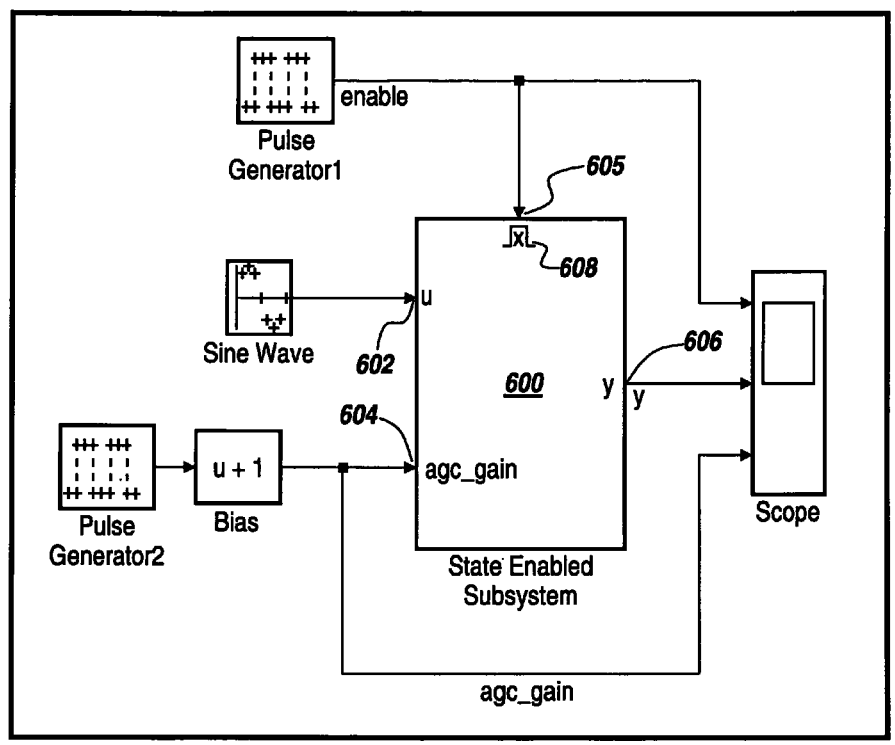
FIG. 6A illustrates an exemplary state enabled system having output and state update operations associated therewith and configured by exemplary embodiments to function as a state enabled system.

FIG. 6A illustrates an exemplary subsystem having output and state update operations associated therewith and configured by exemplary embodiments to function as a state enabled system. More specifically, FIG. 6A illustrates an exemplary state enabled system 600 in a graphical model that may model a system. The state enabled system 600 includes an input port 602, an input port 604, an enable input port 605, an output port 606, and a visual identifier 608 indicating that only the state methods (update, derivatives are controlled by the enable signal). The input ports 602 and 604 may receive information, e.g. in the form of signals, from blocks that may be connected to the graphical structure 600.

The input port 605 may receive information, e.g. in the form of an enable signal, relating to a condition. The condition may control the execution of the state update operations that are associated with the state enabled system 600. As one example, the update operation associated with the unit delay block 620 may be configured to execute when the enable signal received by the input port 605 is greater than zero.

It is expressly noted, that state enabled systems can be applied to other forms of subsystems within time-based block diagrams, such as Simulink. For example, 'state enabled' versions of the Triggered Subsystems or Triggered and Enabled Subsystem found within Simulink 6.6 can be created. A State Triggered Subsystem (created using the techniques disclosed herein) is a form of a state enabled system, wherein the state update methods are executed only when the trigger condition is true, e.g. on a rising, falling, or either edge of the trigger signal connected to the subsystem. Similarly, a State Triggered and Enabled Subsystem (created using the techniques disclosed herein) is a form a state enabled system, wherein the state updated methods are executed only when the trigger condition is true and the enabling signal is greater than zero. Other forms of system preconditions are possible, the enable condition may be value-based or execution-based, for example, a function-call or action signal in the Simulink® modeling environment is action-based where the caller 'invokes' the state enabled system (represented as a state-enabled Function-Call or Action Subsystem). When the caller invokes a State Enabled Function-Call or State Enabled Action Subsystem, the caller is responsible for indicating if the output methods are to execute or if both the output and update methods are to execute.

It is expressly noted, that state enabled systems can be applied to other modeling domains. For example, in data flow models blocks generally execute upon the arrival of data. In this modeling domain, the state enabled systems update methods would execute when data was received at an enabling condition port. Another example of a modeling domain where the state enabled systems can be applied is to State Chart Models, where in an enabling condition determines whether or not the chart transitions states while the output methods (generally chart actions) continue to execute regardless of the enabling condition.

The output 606 of the state enabled system 600 may transmit information, e.g. in the form of a signal, to a scope block that is connected to the output port 606 of the state enabled system 600.

The Enable block 608 may identify to a user that an execution of operations associated with the state enabled system 600 may be conditioned based on a specified configuration. This may be done by selecting an option in a dialog box associated with the Enable Port block 608.

In this example, the state enabled system 600 represents a subsystem that has a hierarchical structure of graphical structures. The visualization of the state enabled system 600 may represent the root or top level of the subsystem. A user may descend into the hierarchy of the state enabled system 600 to view its contents.

Figure 6B:
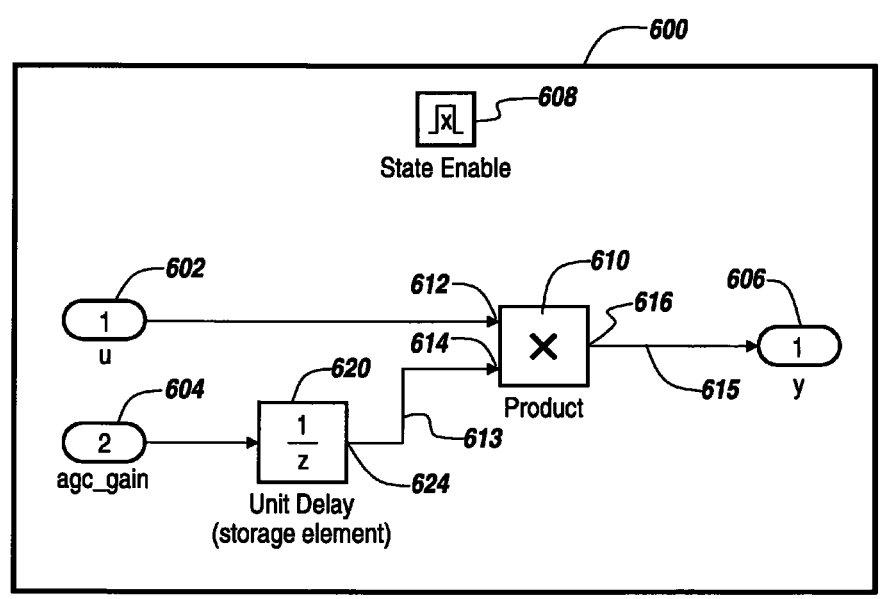
FIG. 6B illustrates a sublevel view of the exemplary state enabled system of FIG. 6A.

FIG. 6B depicts such a sublevel view of the contents of the state enabled system 600 upon descending into the hierarchical structure of the state enabled system 600. The sublevel of the state enabled system 600 includes a Product block 610 and a Unit Delay block 620. During execution, the Product block 610 performs an output operation (generally referred to as the block output method) by computing the product of two inputs, and the Unit Delay block 620 performs both output and update methods using its internal state and the inputs to the product block 610.

The Product block 610 has an input port 612, an input port 614 and an output port 616. The input port 612 of the Product block 610 is connected to the output port of an Inport block 602 which corresponds to the sine wave signal of FIG. 6A. The input port 614 of the Product block 610 is connected to an output port 624 of the Unit Delay block 620 via a signal line 613. The Product block 610 computes the product of the sine wave signal connected to the input port 612 and the delayed (latched) agc_gain signal at the input port 614. The output port 616 of the Product block 610 is connected to the input port of the Outport block 606 via signal line 615, so that outputs computed using Product block 610 are displayed via a scope block external to the graphical structure 600. The output port 624 of the Unit Delay block 620 is connected to the input port 614 of the Product block 610 via signal line 613 to provide a delayed (latched) agc_gain signal used by the Product block 610.

The Product block 610 may execute output operations, in which the product block receives an input signal, u, at the input port 612 and a delayed (latched) agc_gain signal, at the input port 614, and generates an output signal, y, at the output port 616. The Unit Delay block 620 may execute output update operations, in which it receives an input signal, agc_gain, and generates an updated state, x. The output method of the unit delay copies the state to the block's output.

In the specific example illustrated in FIGS. 6A and 6B, the enable signal at the input port 605 of the state enabled system 600 is a periodic rectangular function with a maximum value above 1 and a minimum value of 0. The input signal u at the input port 612 of the product block 610 is a sine wave. The input signal at the input port 604 is a periodic rectangular function a maximum of 2 and a minimum value of 1.

The subsystem 600 is executed in a simulation loop, wherein the execution time, t, is incremented by a step size, h, at the end of each iteration of the loop. The execution of the output operations of the Product block 610 and the Unit Delay block 620 result in the overall output operation (3) of the subsystem 600. Execution of the state update operation of the Unit Delay block 620 results in the update operation (4) of the subsystem 600.

Output Operation (Output Method of the Enabled Subsystem):

$$delay(t) = x(t)$$

$$y(t) = u(t)*delay(t) \quad (3)$$

Update Operation (Update Method of the Enabled Subsystem):

$$x(t+h) = agc\_gain(t) \quad (4)$$

where the output method can be simplified to y(t)=u(t)+x(t).

The state enabled system 600 may be configured to control when the operations associated with the state enabled system 600 are executed. For example, the user may configure the state enabled system 600 so that the update operation associated with the unit delay block 620 does not execute until a condition is satisfied, while the output operation associated with the product block 610 executes independent of any condition. Alternatively, or in addition, the blocks 610 and 620 may be independently configured to control when operations associated with the blocks are executed. As previously discussed, the behavior of a state enabled system differs from that of traditional conditionally-executed systems in that its output operations continue to execute when the system is not executing.

The simulation loop for executing or simulating the model of FIGS. 6A and 6B is set forth below:

```
Initialize:
    x(t) = 0; // Initial condition of the Unit Delay
SimLoop:
    Outputs:
        u(t) = SineWave(t);
        agc_gain(t) = pulse2(t)+1;
        y(t) = EnabledSubsystemOutput(t,u,agc_gain);
        Scope(pulse1(t),y(t),agc_gain(t));
    Update:
        if (pulse1(t) > 0) {
            x(t+h) = EnabledSubsystemUpdate(t,x,u);
        }
EndLoop
EnableSubsystemOutput:
    y(t) = u(t)*x(t)
EnabledSubsystemUpdate
    x(t+h) = agc_gain(t) ;
```

Configuration of when an execution of operations occurs provides the user with flexibility when modeling systems. For example, allowing a user to configure the execution of operations associated with the state enabled system 600 results in a more accurate modeling of the output behavior of systems, which is depicted in FIG. 7.

Figure 7:
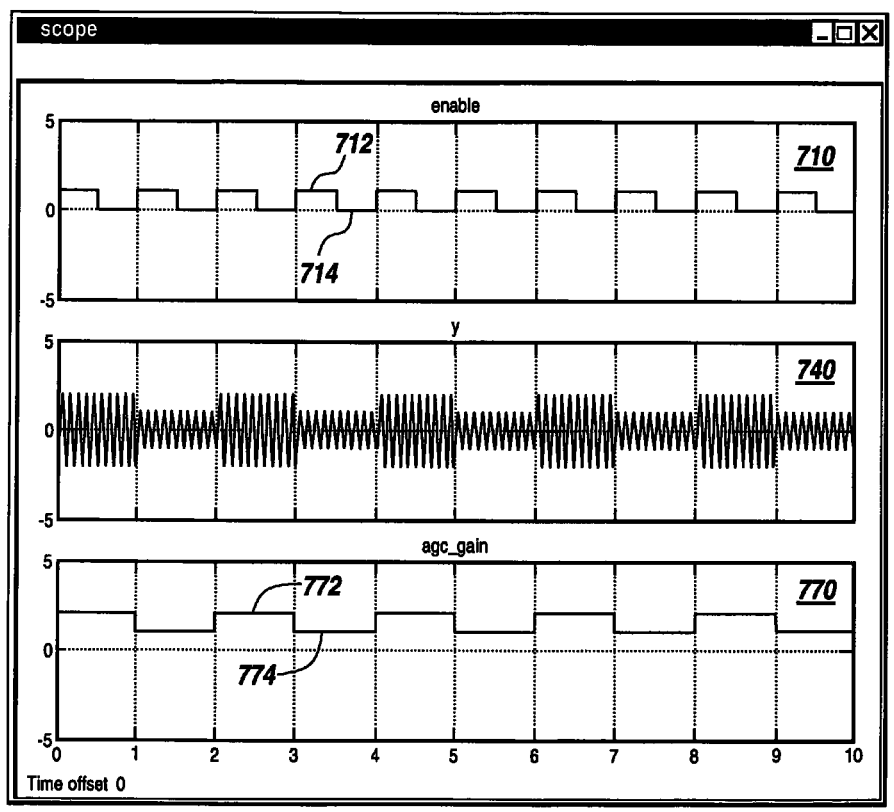
FIG. 7 illustrates the desired output behavior of the exemplary state enabled system of FIGS. 6A and 6B configured by exemplary embodiments to function as a state enabled system.

FIG. 7 illustrates the desired output behavior of the state enabled system 600 of FIGS. 6A and 6B according to exemplary embodiments. The enable signal depicts the enable signal which turns on to a maximum value (712) at every clock tick and remains at zero (714) for the remaining time, and is displayed in enable view 710. The agc_gain input signal depicts the agc_gain input signal that alternates between a maximum value (772) and a minimum value (774), and is displayed in agc_gain input view 770.

The y output signal is displayed in y output view 740. Unlike in a conventional enabled system, exemplary embodiments apply the enable signal only to the state update operation and not to the output operation performed by the system. The output operation is performed regardless of the 'active' or 'enable' status of the system, i.e. when the enable signal is on and also when it is off. As such, the y output signal is equal to the sine wave input signal multiplied by the agc_gain input signal when the subsystem is enabled and also when it is not enabled, i.e. when the enable signal is on and also when it is off (712, 714).

In some exemplary embodiments, the graphical model, or a portion thereof that includes the graphical structure may be used to generate code that describes a hardware implementation of the graphical structure. The code may be generated in a hardware description language, such as Verilog or Very High Speed Integrated Circuit Description Language (VHDL). After the code is generated it may be implemented in a hardware device, such as a Field Programmable Gate Array (FPGA). The improved semantics of the modeling environment may allow for direct and efficient translation of models containing conditionally executed systems to custom hardware since the models may accurately reflect the actual behavior of a system being modeled.

It should be appreciated that exemplary embodiments may be applied to different types of graphical models in a graphical modeling environment, e.g. block diagram models, data flow block diagrams, etc. Block diagrams models are signal-based models in which blocks in the model are connected through signals that connect the outputs and inputs of blocks. Data flow block diagrams are diagrams of entities (nodes) with connections (lines) between them that describe a graphical programming paradigm where the availability of data is used to initiate the execution of blocks, where a block represents an operation and a line represents execution dependency describing the direction of data flowing between blocks.

Figure 8:
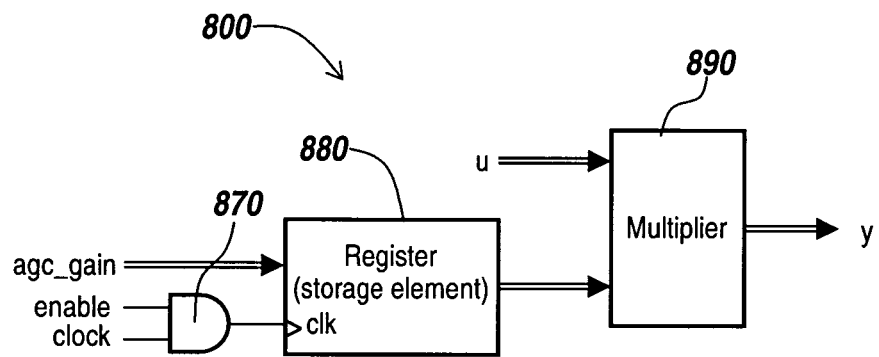
FIG. 8 illustrates a block diagram of an exemplary hardware circuit for the exemplary state enabled system of FIGS. 6A and 6B.

FIG. 8 depicts a block diagram of an exemplary hardware circuit 800 for the implementation of the state enabled system 600 according to exemplary embodiments. The hardware circuit 800 for subsystem matches the desired output behavior illustrated in FIG. 7 and eliminates the need for extra storage elements. The hardware circuit 800 includes a storage element 880, e.g. an n-bit register, an AND gate 870 and a multiplier 890.

Synthesizing hardware for state enabled system 600 is efficient because there is no need for extra storage elements to hold the output of the system. In addition, there is no need for extra logic to control the enabling of the output operations because they are never disabled. Furthermore, the state enabled system 600 achieves modularity, i.e. the constituent blocks can be logically grouped together into subsystems in a meaningful manner. For example, state enabled system 600 allows grouping of the Unit Delay block 620 and the Product block 610 into one subsystem.

Exemplary embodiments may provide one or more user interfaces to allow a user to configure a state enabled system for conditional execution of its operation, e.g. through a dialog box. A user may also configure a state enabled system with the use of an XML file, a textual user interface, a command-line interface, and Application Programming Interface (API), etc.

Alternatively, a state enabled system may be configured without the aid of a user, e.g. by configuration specifications supplied by the model or the modeling environment itself. In some embodiments, the configuration specifications may be based on default settings. In other embodiments, the configuration specifications may be determined from the structure, semantics and/or parameters of the model or the state enabled system.

IV. A Second Example of a State Enabled System

Figure 9A:
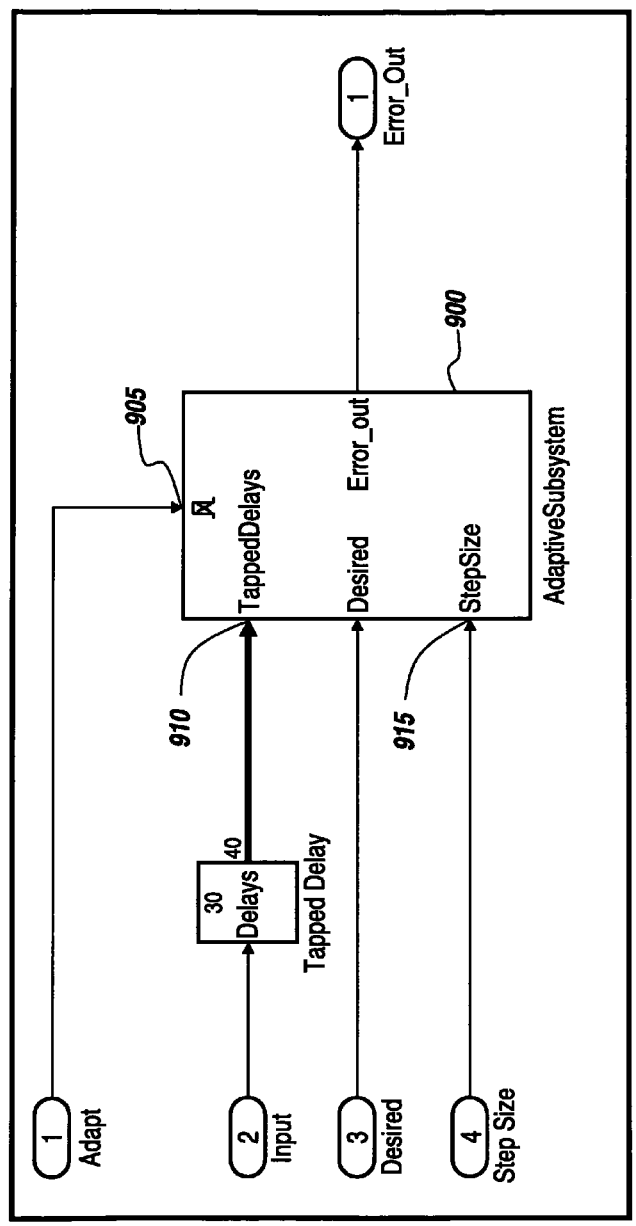
FIG. 9A illustrates an exemplary state enabled adaptive filter called AdaptiveSubsystem.

FIG. 9A illustrates an exemplary adaptive filter, such as a filter based on the least mean square (LMS) algorithm, configured to function as a state enabled system. The LMS algorithm can be used for many purposes. In some applications, the tap weights or adaptive filter coefficients of the LMS algorithm are updated continuously while the algorithm is processing input data. In other cases, the change in the tap weights is controlled by an input that enables adaptation when active and holds the current tap weights when inactive. More specifically, FIG. 9A illustrates an exemplary state enabled adaptive filter 900 called AdaptiveSubsystem. The state enabled system 900 includes an input port 905 connected to an Adapt signal as an enable signal, an input port 910 which is a vector of length 40 of inputs from the tapped delay line called TappedDelays, and an input port 915 receiving a StepSize signal.

Figure 9B:
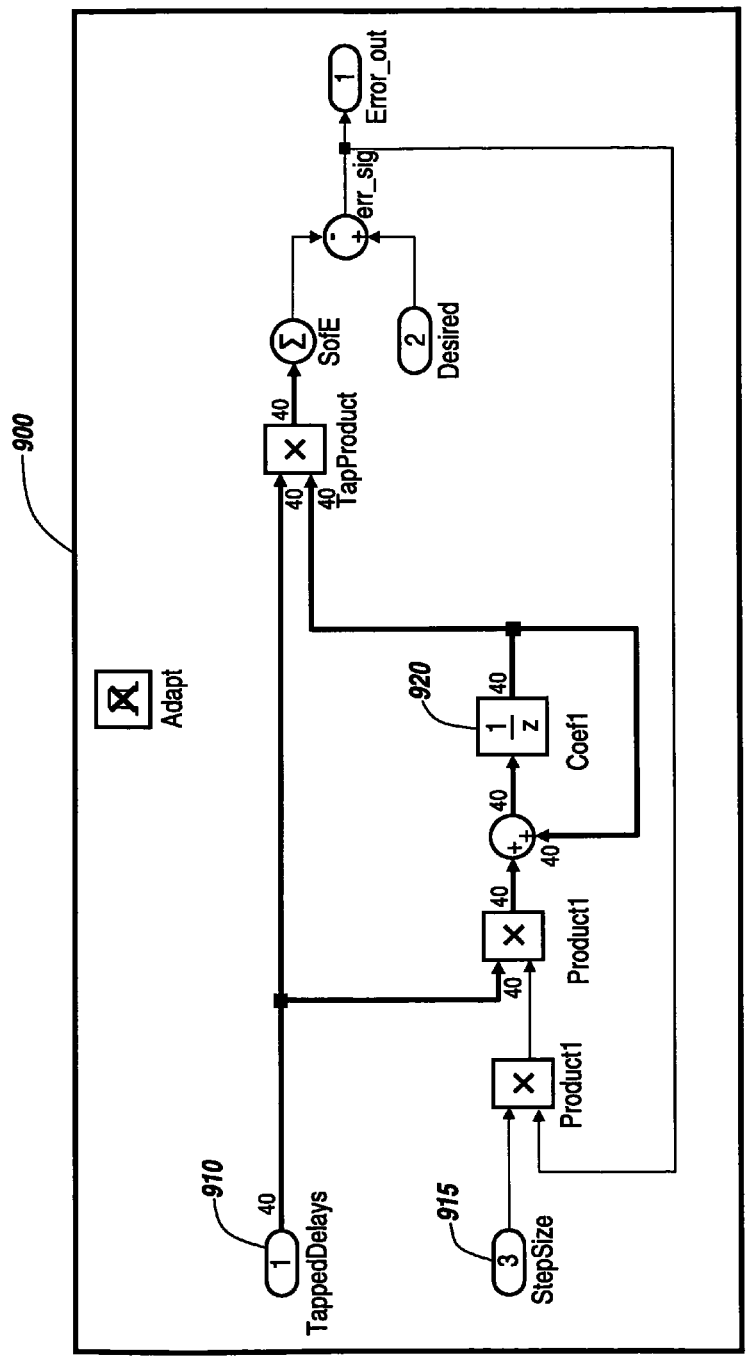
FIG. 9B illustrates a sublevel view of the contents of the state enabled adaptive filter system of FIG. 9A.

FIG. 9B depicts a sublevel view of the contents of the state enabled adaptive filter system 900 upon descending into its hierarchical structure. The sublevel of the state enabled adaptive filter system 900 includes a Coef1 Unit Delay block 920 which represents a storage element for the tap weights.

Because the adaptive filter 900 is a state enabled system, the enable signal Adapt only controls the state update equations and, thus, only affects the update of the state for the Coef1 Unit Delay block 920 containing the tap weights. This behavior closely matches the behavior of hardware designs, e.g. FPGAs and ASICs. By making the enable input active or inactive, control over the adaptation of the filters is achieved, while the rest of the adaptive filter system continues to operate as if there were no enable signal.

In contrast, in a conventional enabled subsystem the outputs equations associated with the blocks in AdaptiveSubsystem would not be evaluated when the enable signal was inactive, and the system would not match the expectations of a hardware-based system.

The tapped delay line leading to the input port 910 of AdaptiveSubsystem must remain external to AdaptiveSubsystem in order to obtain the desired update operation. In this situation, building a model where only the storage elements are in conventional enabled subsystems would not produce a desired behavior because some portions of the model include both computations of outputs and updates of internal storage elements. For example, a problem encountered when using a conventional enabled subsystem is that many more complicated blocks, such as the LMS filter block in the Signal Processing Blockset (from the MathWorks), have both the computation of outputs and the update of internal storage elements. It is not practical or desirable, in general, to separate the two different aspects in the model because of the loss of model readability and the technical challenge of separation for non-trivial blocks such as the LMS filter block. Creating a state enabled subsystem 900, according to exemplary embodiments, that only enables the update of states or storage elements cures the above deficiencies.

V. A Third Example of a State Enabled System

Figure 10A:
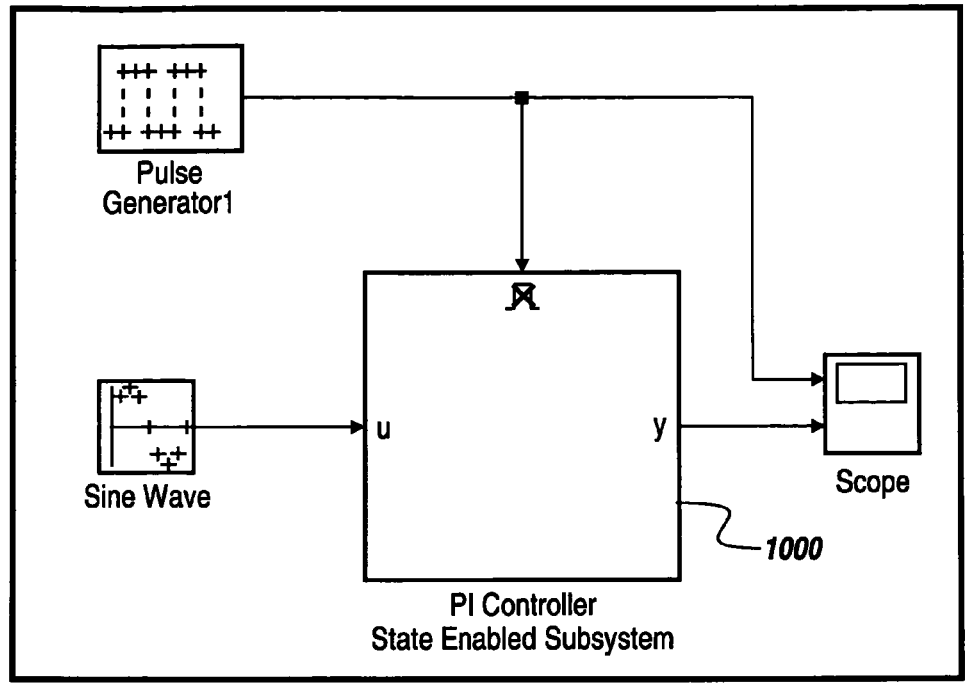
FIG. 10A illustrates a PI Controller State Enabled Subsystem.
Figure 10B:
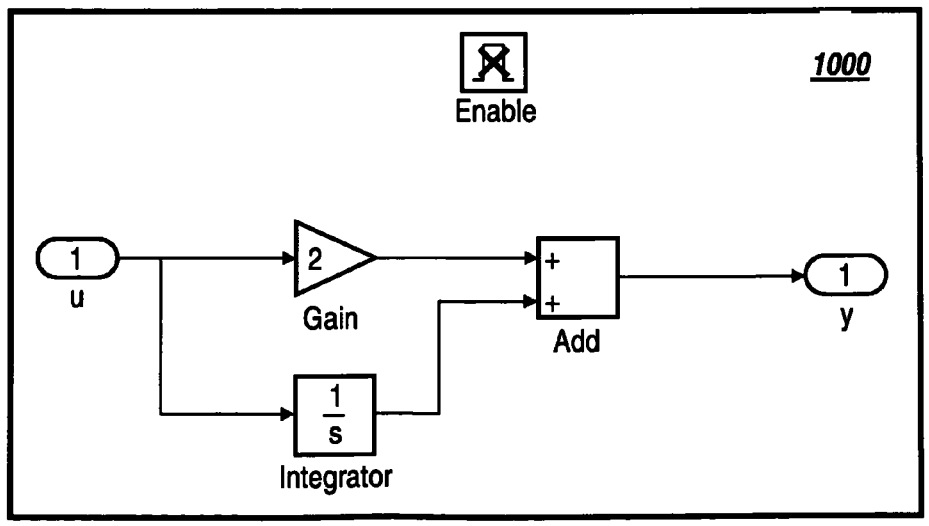
FIG. 10B illustrates a sublevel view of the contents of the PI Controller State Enabled Subsystem of FIG. 10A.

The models illustrated in FIGS. 6 and 9 are discrete models with only output and update equations. Exemplary embodiments are, however, not limited to discrete models and may apply to any system that includes multiple forms of state updates. One such system is a continuous-time system like the Proportional/Integral (PI) Controller 1000 illustrated in FIG. 10A. The PI Controller 1000 is configured to function as a state enabled system. FIG. 10B depicts a sublevel view of the contents of the PI Controller State Enabled Subsystem 1000.

Placing the PI Controller 1000 in a state enabled system allows the system designer to 'freeze' an integration operation when the PI Controller State Enabled Subsystem is disabled. Freezing the integration may be desirable upon certain conditions, e.g. when the input signal is in a particular region. In this case, it is desirable to use merely a proportional control with the last integration added in. This state enabled system can be realized in hardware using either analog integration or a circuit performing numerical integration, such as Euler integration. In simulations, numerical integration is typically used.

The simulation loop for the model illustrated in FIGS. 10A and 10B containing the PI Controller State Enabled Subsystem using Euler integration is set forth as follows:

```
Initialize:
    x(t) = 0; // Initial condition of the Integrator
SimLoop:
    Outputs:
        u(t) = SineWave(t);
        y(t) = PIControllerStateEnabledSubsystemOutput(t,u);
        Scope(pulse(t),y(t));
    Integrate:
        if (pulse(t) > 0) {
            x(t+h) = PIControllerStateEnabledSubsystemIntegrate(t,x,u);
        }
        t = t + h
EndLoop
PIControllerStateEnableSubsystemOutput:
    Integrator_out(t) = x(t) ;
    Gain_out(t) = 2*u(t);
    y(t) = Integrator_out(t) + Gain_out(t);
PIControllerStateEnabledSubsystemIntegrate
    x(t+h) = h*u(t);
```

VI. A Fourth Example of a State Enabled System

Exemplary embodiments may also be used to apply the concept of state enabled systems to state charts. State charts may enable graphical representation of states and transitions between them, such as the state charts enabled by Stateflow® modeling environment from The MathWorks, Inc. A state chart may belong to one of several classes, e.g. Mealy, Moore, etc, as described in U.S. Pat. No. 7,840,913. In Mealy charts, the output is a function of states and inputs. In Moore charts, the output is a function of only states. For more elaborate forms of state charts, e.g. Stateflow® charts with events, exemplary embodiments may be applied if it is possible to separate outputs from state updates. It should be appreciated that a graphical model in one modeling domain may include entities that are based on other modeling domains within the graphical model. A common characteristic among these various forms of graphical models is that they define semantics on how to execute them.

Figure 11A:
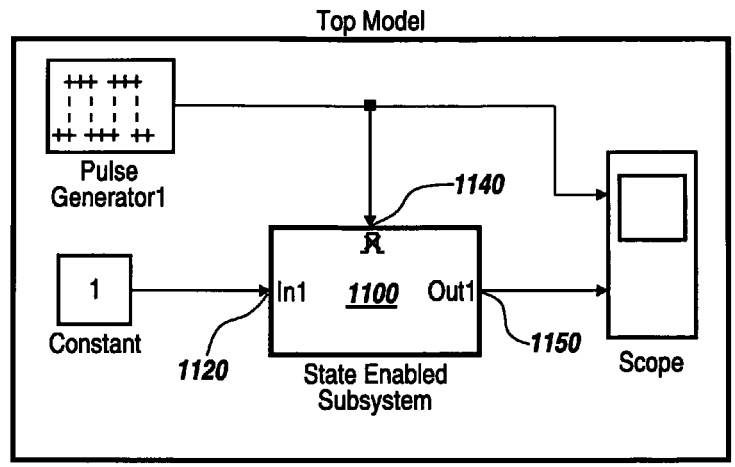
FIG. 11A illustrates an exemplary state enabled system including a state chart configured to update its state based on an enable condition or signal.
Figure 11B:
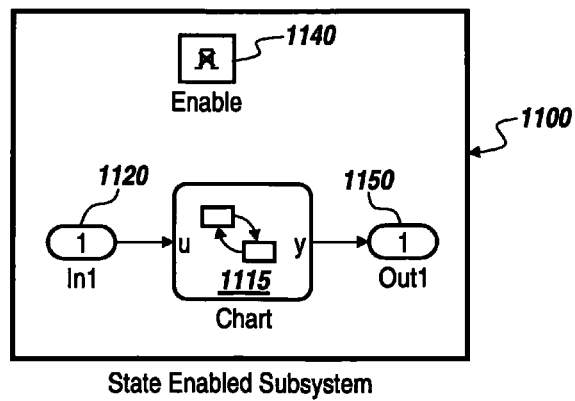
FIG. 11B illustrates a sublevel view of the contents of the state enabled system of FIG. 11A.
Figure 11C:
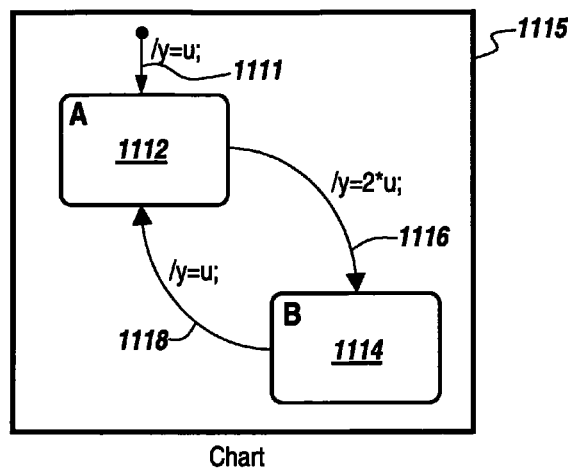
FIG. 11C illustrates a sublevel view of the contents of the state chart contained in the state enabled system of FIG. 11B.

FIGS. 11A-C depict an exemplary state enabled system 1100 including a state chart 1115 that is configured to update its state based on an enable condition or signal. FIG. 11A depicts a view of the state enabled system 1100 in which the state chart 1115 models a system using states and state transitions, and performs an output operation and a state update operation. The state enabled system 1100 includes an input port 1120 which is connected to a constant input for its output operation, and an input port 1140 which is connected to a periodic pulse input as an enable signal for its state update operation. It must be noted that the enable signal is not restricted to the form a periodic pulse and can take other forms. An output signal 1150 is the output generated by the output operation of the state enabled system 1100.

The visualization of the state enabled system 1100 may represent the root or top level of the state enabled system 1100. A user may descend into the hierarchy of the state enabled system 1100 to view its contents. FIG. 11B depicts such a sublevel view of the contents of the state enabled system 1100 which shows its constituent state chart 1115. The input of the state chart 1115, u(t), is the constant signal 1120. An output operation of the state chart 1115 generates an output, y(t), based on the input u(t) and the state x(t) of the state chart 1110.

FIG. 11C, in turn, depicts a sublevel view of the contents of the state chart 1115. The state chart 1115 includes two states: state A (1112) and state B (1114). The output is originally set to the input (1111). If the current state is state A, then the output is twice the value of the input. The state transitions from state A to state B (1116). However, if the current state is state B, then the output is the same as the value of the input. The state transitions from state B to state A (1118). This output operation of the state chart 1115 is represented formally below:

```
StateEnableSubsystemOutput:
    if (x(t) == A) {
        y(t) = 2 * u(t); // transitioning to state B
    } else {
        y(t) = u(t); // transitioning to state A
    }
```

The state of the state chart 1115, x(t), is initialized to state A (1111) by an initialize operation. The state x(t) is then updated by a state update operation based on the current state. If the current state is state A, then the new state is set to state B. However, if the current state is state B, then the new state is set to state A. The initialize and state update operations are represented formally below.

```
x(t) = A; // Initial condition of the state chart
StateEnabledSubsystemUpdate:
    x(t + h) = x(t) == A ? B: A;
```

Since the state chart 1115 is included in a state enabled system, exemplary embodiments allow the output operation of the state chart to continue to execute even when the state enabled system is inactive or disabled, e.g. when the enable signal is zero or lower than zero. In addition, exemplary embodiments execute the state update operation of the state chart only when the state enabled system is active or enabled, e.g. only when the enable signal is greater than zero.

Figure 11D:
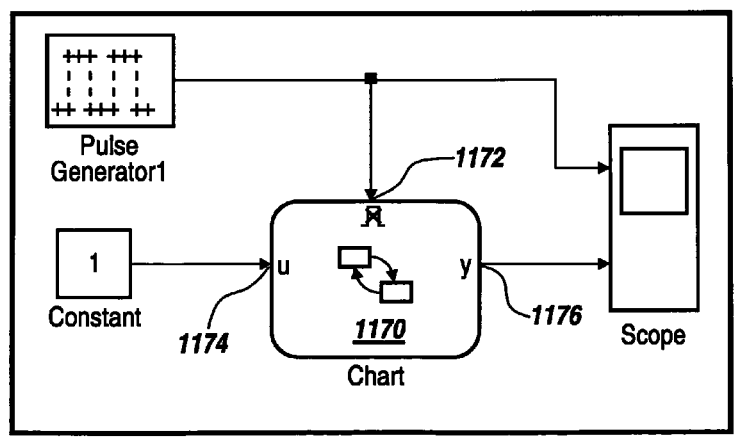
FIG. 11D illustrates an exemplary state chart that is itself a state enabled system configured to update its state based on an enable condition or signal.
Figure 11E:
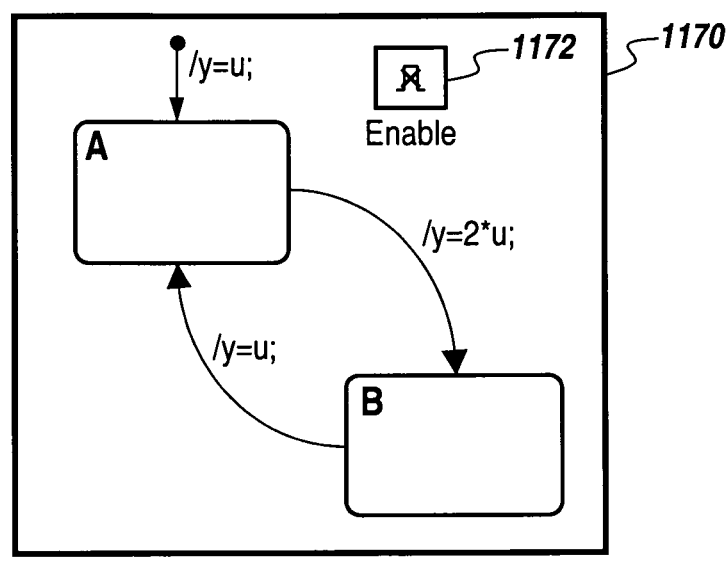
FIG. 11E illustrates a sublevel view of the contents of the state chart of FIG. 11D.

FIGS. 11D and 11E depict an exemplary state chart 1170 that is itself a state enabled system configured to update its state based on an enable condition or signal. FIG. 11D depicts a view of the state chart 1170 which includes an input port 1174 which receives a constant input for its output operation, and an input port 1172 which receives a periodic pulse input as an enable signal for its state update operation. An output signal 1176 is the output generated by the output operation of the state chart 1170. FIG. 11E depicts a sublevel view of the contents of the state chart 1170, the state chart itself being a state enabled system. The state chart 1170 is provided with an Enable input port 1172 at which it receives the enable signal.

Since the state chart 1170 is a state enabled system, exemplary embodiments allow the output operation of the state chart to continue to execute even when the state chart is inactive or disabled, e.g. when the enable signal is zero or lower than zero. In addition, exemplary embodiments execute the state update operation of the state chart only when the state chart is active or enabled, e.g. only when the enable signal is greater than zero.

VII. Other Forms of State Enabled Systems

Thus far, the concept of state enabled systems has been illustrated using state enabled subsystems in which an enable signal determines when the contents of the state chart are enabled. However, there are other forms of hierarchy in block diagram models that also fall into the class of state enabled systems. For example the Simulink® modeling environment includes the notion of action signals and function-call signals that do not carry data, but control when a hierarchical node (subsystem) executes. The caller of these nodes determines if the called systems are enabled.

A hierarchical node representing an encapsulated model saved in a separate file may also be configured to function as a state enabled system. Such nodes may be extended to have a property or block which allows one to specify that the nodes should execute according to state enabled semantics, i.e. outputs should run continually but state updates should run only when the nodes are enabled.

VIII. Execution Control and Code Generation

Figure 12:
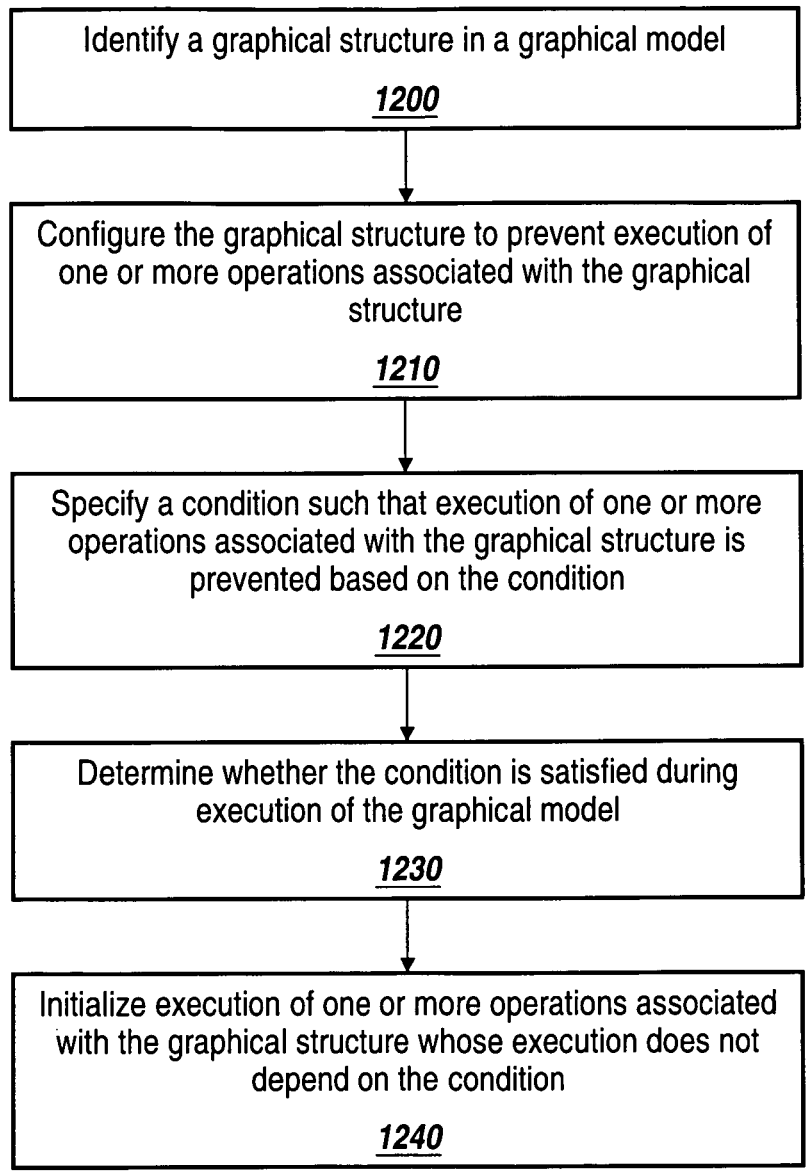
FIG. 12 is a flow diagram that illustrates an exemplary configuration of the state enabled system.

FIG. 12 is a flow diagram that illustrates controlling an execution of an operation associated with a state enabled system. A state enabled system may be identified in a graphical model or a graphical program (step 1200). One or more operations may be associated with the state enabled system. The operations may perform one or more algorithmic operations and may be provided for computing an output, computing a derivative, computing an integral, updating a state, etc. The state enabled system may be configured to prevent an execution of one or more operations associated with the state enabled system (step 1210). A condition may be specified such that the execution of the one or more operation is prevented unless the condition is satisfied or until the condition is no longer satisfied (step 1220). The modeling environment may determine whether the condition is satisfied during an execution of the graphical model (step 1230). The modeling environment may then initialize execution of one or more operations associated with the state enabled system whose execution does not depend on a condition (step 1240).

Figure 13:
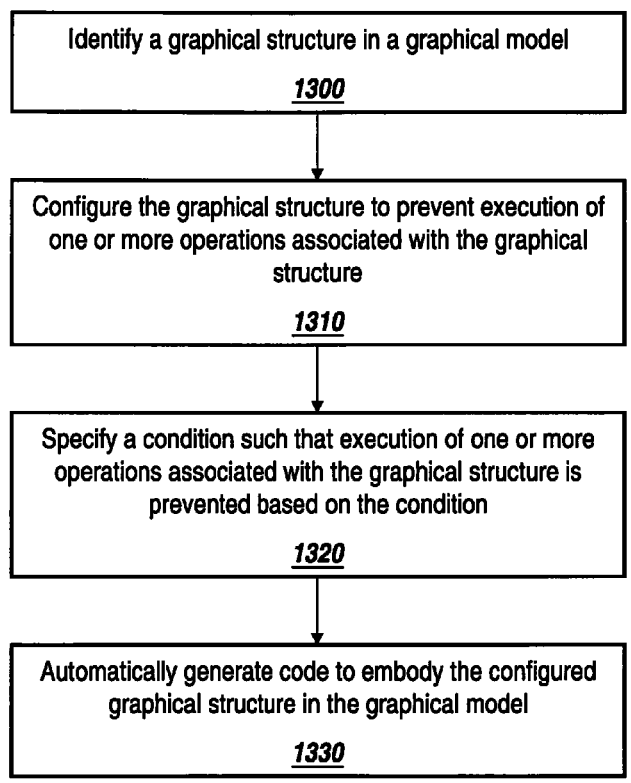
FIG. 13 is a flow diagram that illustrates exemplary automatic code generation associated with the configured state enabled system.

FIG. 13 is a flow diagram that illustrates exemplary automatic code generation associated with the configured state enabled system. A state enabled system may be identified in a graphical model or a graphical program (step 1300). One or more operations may be associated with the state enabled system. The operations may perform one or more algorithmic operations and may be provided for computing an output, computing a derivative, computing an integral, updating a state, etc. The state enabled system may be configured to prevent an execution of one or more operations associated with the state enabled system (step 1310). A condition may be specified such that the execution of the one or more operation is prevented unless the condition is satisfied or until the condition is no longer satisfied (step 1320). After the configuration of the state enabled system, code associated with the configured state enabled system in the graphical model may be automatically generated (step 1330). Execution of the generated code may implement the functionality embodied by the state enabled system in the graphical model.

IX. Exemplary Modeling Environment

The above examples depict a modeling environment for implementing block diagram system models, such as the Simulink® modeling environment from The MathWorks, Inc. The Simulink® modeling environment provides tools for modeling and simulating a variety of dynamic systems in one integrated, graphical environment. The Simulink® modeling environment enables users to design a block diagram for a dynamic system, simulate the system's behavior, analyze the performance of the system, and refine the design of the system. The Simulink® modeling environment allows users to design models of systems through a user interface that allows drafting of block diagrams representing systems. All of the blocks in a block library provided by the Simulink® modeling environment and other programs are available to users when the users are building the block diagram.

Individual users may be able to customize this model block to: (a) reorganize blocks in some custom format, (b) delete blocks they do not use, and (c) add custom blocks they have designed. The blocks may be dragged through some human-machine interface (such as a mouse or keyboard) from the block library on to the window (i.e., model canvas). The Simulink® modeling environment also allows users to simulate the models to determine the behavior of the systems. The Simulink® modeling environment includes a block diagram editor that allows users to perform such actions as draw, edit, annotate, save, and print out block diagram representations of systems. The block diagram editor is a graphical user interface (GUI) component that allows drafting of block diagram models by users. In the Simulink® modeling environment there is also a textual interface with a set of commands that allow interaction with the graphical editor, such as the textual interface provided in the MATLAB® software application. Using this textual interface, users may write special scripts that perform automatic editing operations on the block diagram. The Simulink® modeling environment also allows users to simulate the models to determine the behavior of the systems. The Simulink® modeling environment includes a block diagram execution engine that carries out the task of compiling and linking the block diagram to produce an 'in-memory executable' version of the model that is used for generating code and/or simulating a block diagram model.

Configurable conditionally executed operations in exemplary embodiments may be implemented in an environment like the Simulink® modeling environment. Other environments suitable for implementing configurable conditionally executed operations include an event-based environment provided by the SimEvents® software application from The MathWorks, Inc., data flow diagrams, or the like. Some other environments that may be suitable for implementing configurable conditionally executed subsystems include any graphical modeling or graphical programming using software products such as LabVIEW® or MATRIXx from National Instruments, Inc., Mathematica® from Wolfram Research, Inc., Maple™ from Maplesoft, Dymola from Dynasim AB, Extend from Imagine That, Inc., Scilab™ and Scicos from The French National Institution for Research in Computer Science and Control (INRIA), SCADE™ from Esterel Technologies, Inc., among others. Furthermore, one ordinarily skilled in the art will appreciate that exemplary embodiments may apply to other environments, such a Unified Modeling Language (UML) modeling environment, a SysML modeling environment, or environments for modeling of physics domains.

Figure 14:
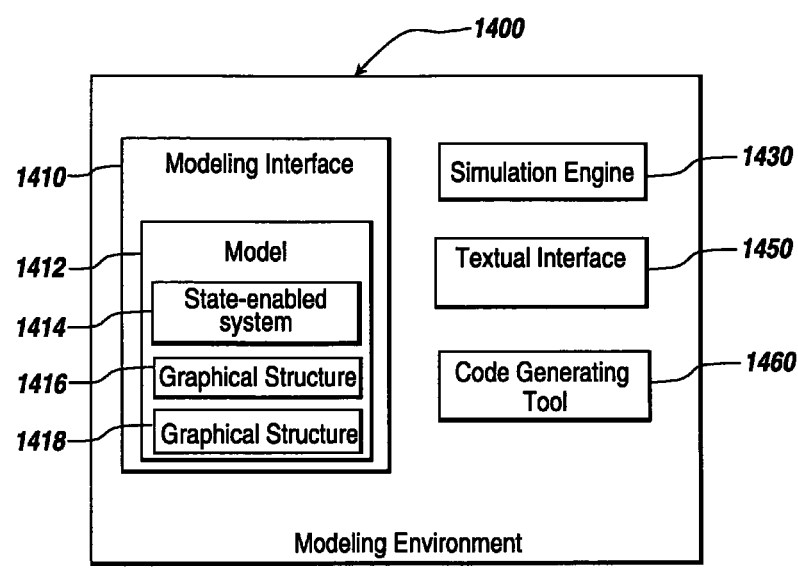
FIG. 14 illustrates a block diagram of an exemplary modeling environment that may be used for implementing exemplary embodiments.

FIG. 14 depicts a high-level block diagram of an exemplary modeling environment 1400 (hereinafter environment 1400) that may be used for implementing various exemplary embodiments. The implementation of FIG. 14 is illustrative and can take other forms. For example, an alternative implementation of the modeling environment 1400 may have fewer components, more components, or components that are in a configuration that differs from the configuration of FIG. 14. The components of FIG. 14 and/or other figures described herein may be implemented in hardware based logic, software based logic and/or logic that is a combination of hardware and software based logic (e.g., hybrid logic); therefore, the components of FIG. 14 and/or other figures are not limited to a specific type of logic.

The environment 1400 may include a modeling interface 1410, a simulation engine 1430, a textual interface 1450, and a code generating tool 1460. The environment 1400 allows a user to develop models in the modeling interface 1410. Using the modeling interface 1410, a user can create a model 1412 that includes, for example, the state enabled systems 1414, 1416, and/or 1418. The state enabled systems 1414, 1416 and/or 1418 may be provided to model a system, such as a dynamic system. The user may use predefined state enabled systems or custom state enabled systems to develop a model.

Some examples of state enabled systems that may be configured for conditional execution may include elements, subsystems that include a hierarchy of elements or the like. Elements may represent, but are not limited to continuous and/or discrete dynamics elements, such as integration elements, unit delay elements, etc.; algorithmic elements, such as sum, product, lookup tables, etc.; and/or structural elements, such as multiplexers, switches, signal or bus selectors, etc. Elements may be used in a graphical model to develop a model of a system, such as a dynamic system.

The textual interface 1450 may allow a user to develop a user-defined element with a sequence of commands in a textual language. The textual interface 1450 can also facilitate debugging and/or profiling of a model. Alternatively, implementations of the environment 1400 may include a separate debugger and profiler.

The simulation engine 1430 may communicate with the modeling interface 1510. The simulation engine 1430 may receive a model such as, for example, a block diagram model, an event-based model, a UML model, etc., that is generated using the modeling interface 1410. The simulation engine 1430 may convert the model created in the modeling interface 1410 to an executable form, referred to as a compiled model. The simulation engine 1430 may repetitively execute the compiled model e.g., via successive time steps from a simulation start time to a stop time specified by the user or until the simulation is interrupted. Alternatively, the simulation engine 1430 may enable interpretive simulation of the model.

The code generating tool 1460 may be used to generate code, such as source code, object code, a compiled executable or library for forming an executable of a model provided by the modeling interface 1410. The code generating tool 1460 may also be used to generate a hardware description language representation of the model. The code generating tool may use implementations of code for portions of a model to generate executable code, instructions, etc. in a programming language such as Java, Javascript, C or C++ or a hardware description language such as Verilog or VHDL. To generate code, the code generating tool may convert a source model language representation of a model to a target language. The code generating tool 1460 may comprise an extended version of a code building tool such as Real-Time Workshop® from The MathWorks, Inc. of Natick, Mass. or any portion thereof, or may be substantially any software component for generating executable code, instructions, etc., in a programming language such as Java or C or in a hardware description language (HDL) such as Verilog, VHDL, SystemC, etc. In one embodiment, a block diagram model may be translated to generated code by sorting the blocks within the model, generating code based on the sorted blocks, and storing the code in a source file. The source file may then be compiled, linked and executed.

The code generating tool 1460 may generate source code for the execution of a model that is provided by the modeling interface 1410, and may compile the source code into object code and build an executable program, library or substantially any other form of executable instructions. In one embodiment, a piece of logic different from the code generating tool 1460 may compile the source code. The code may be designed to run on any processor, microprocessor, dual-core processor, multi-core processor, cluster of processors, operating system, computational hardware device, component of a computational hardware device, etc. In one embodiment, the code may comprise embedded code targeted to run on an embedded system. Additionally, the code may be customized to run on a specific target hardware platform. For example, the code generated may include fixed-point code to run a fixed-point processor or code may be generated to emulate fixed-point behavior on a floating-point processor.

The environment 1400 may be provided on a single computing device, as described below with reference to FIG. 15, on multiple computing devices (e.g., in a distributed configuration), and/or in other configurations (e.g., a multi-core implementation operating on one or more platforms).

X. Exemplary Computing Device

Figure 15:
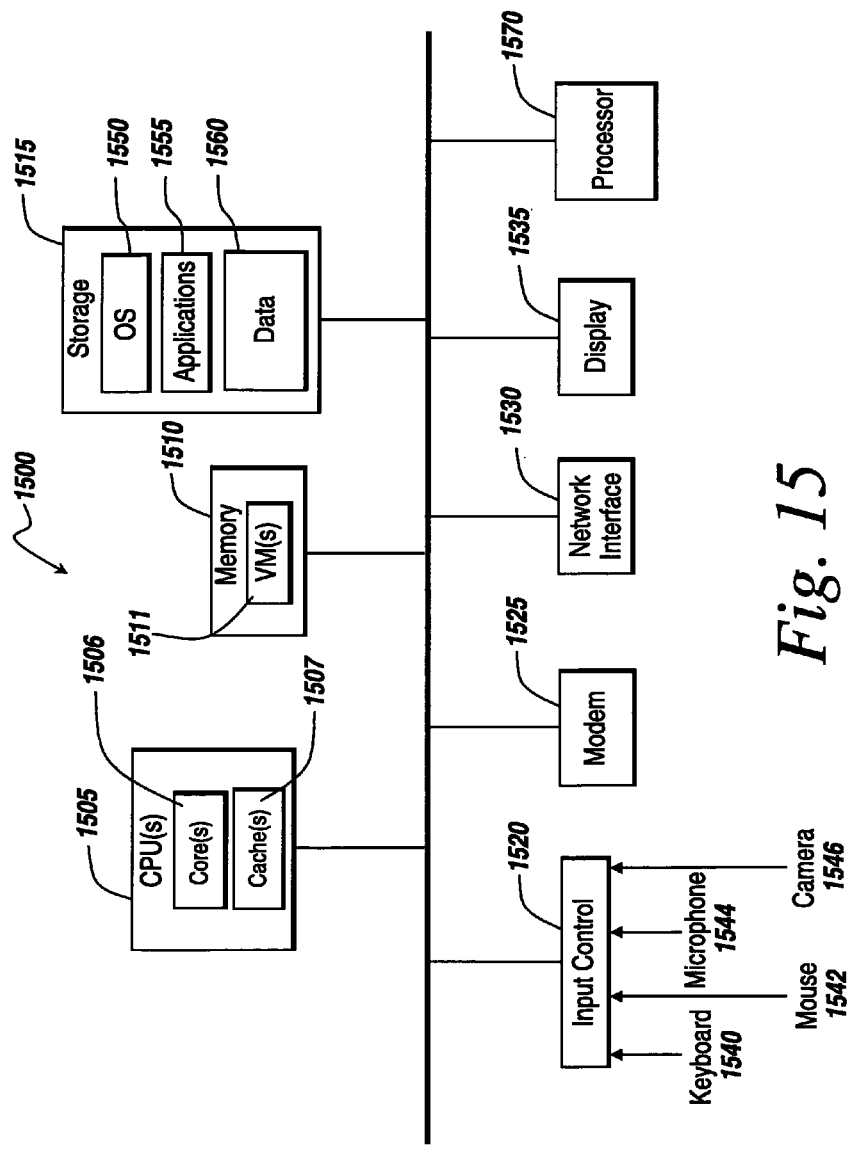
FIG. 15 illustrates an exemplary computing device suitable for practicing exemplary embodiments.

FIG. 15 is an exemplary computing device 1500 that can be configured to practice exemplary embodiments. The implementation of FIG. 15 is illustrative and can take other forms. For example, an alternative implementation of the computing device 1500 may have fewer components, more components, or components that are in a configuration that differs from the configuration of FIG. 15. The components of FIG. 15 and/or other figures described herein may be implemented in hardware based logic, software based logic and/or logic that is a combination of hardware and software based logic (e.g., hybrid logic); therefore, the components of FIG. 15 and/or other figures are not limited to a specific type of logic.

The computing device 1500 may take many forms, including but not limited to a personal computer, workstation, server, network computer, quantum computer, optical computer, bio-computer, Internet appliance, mobile device, a pager, a tablet computer, a smart sensor, application specific processing device, etc.

The computing device 1500 may be electronic and may include a Central Processing Unit (CPU) 1505, memory 1510, storage 1515, an input control 1530, a modem 1525, a network interface 1530, a display 1535, and a processor 1570. The CPU 1505 may control components of the computing device 1500 to provide the environment 1400 or some of the components of the environment 1400. The memory 1510 may store instructions and data, and may provide the instructions and data to the CPU 1505. CPU 1505 may operate the computing device 1500 and may run the environment 1400 or some of the components of the environment 1400 based on the stored instructions.

Optionally, the computing device 1500 may include multiple CPUs 1505 for executing software loaded in the memory 1510, and other programs for controlling system hardware. Each of the CPUs 1505 may be a single or a multiple core processor 1506. The code loaded in the memory 1510 may run in a virtualized environment, such as in a Virtual Machine (VM) 1511. Multiple VMs 1511 may be resident on a single processor. Also, part of the application may run in processor 1570, which may include, for example, a field programmable gate array (FPGA), programmable logic controller (PLC), an application specific integrated circuit (ASIC), an application specific instruction set processor (ASIP), a Fast Fourier Transform (FFT) processing device, etc. Further, part of the applications may be run on analog electronic devices that may be included in the computing device 1500. Other resources, such as, for example, graphics processing unit (GPU), may also be used to run part of the applications.

The storage 1515 may contain software tools for applications. The storage 1515 may include code 1550 for the operating system (OS) of the computing device 1500, code 1555 for applications running on the operation system including the applications for the environment 1400 or some of the components of the environment 1400 and data 1560 generated from the environment 1500 or some of the components of the environment 1500, and/or other code. Portions of applications may be stored in the CPU cache 1507, memory 1510, and/or elsewhere, such as on a remote storage device connected to computing device 1500 via a network, a bus, a dedicated link, etc.

The input control 1520 may interface with a data entry device, such as a keyboard 1540, a pointing/indexing device, such as a mouse 1542, a microphone 1544, a camera 1546, such as a web camera, and/or other input devices. The computing device 1500 may receive, through the input control 1520, input data, such as the input data for developing the model. The computing device 1500 may display on the display 1535 user interfaces for displaying the data generated from the environment 1400 or some of the components of the environment 1400.

Exemplary embodiments may be provided as one or more computer-readable programs or instructions embodied on or in one or more mediums. The mediums may be, but are not limited to a hard disk, a compact disc, a digital versatile disc, a flash memory card, a Programmable Read Only Memory (PROM), a Random Access Memory (RAM), a Read Only Memory (ROM), Magnetoresistive Random Access Memory (MRAM), or a magnetic tape. In general, the computer-readable programs may be implemented in any programming language. Some examples of languages that may be used include Python, C, C++, C#, Java, Javascript etc. Further, the computer readable programs may be implemented in a hardware description language or any other language that allows prescribing computation such as, for example, Deoxyribonucleic acid (DNA). The software programs may be stored on or in one or more mediums as object code.

XI. Exemplary Distributed System

Figure 16:
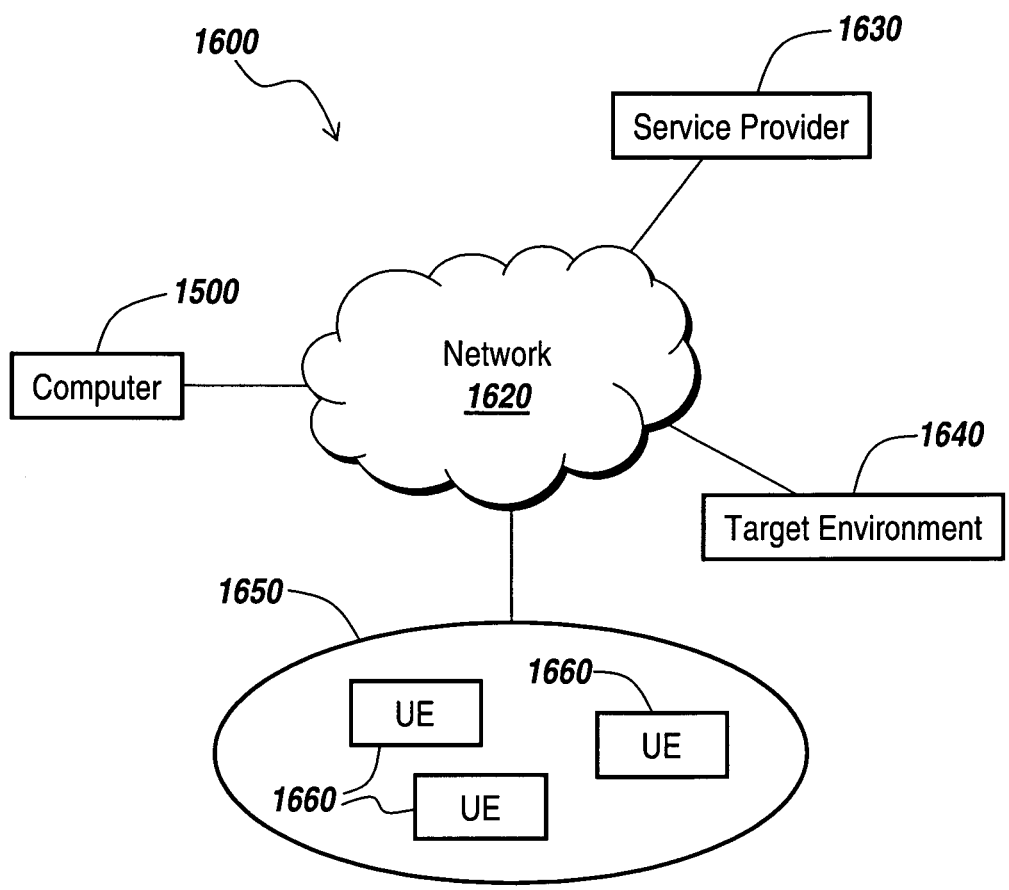
FIG. 16 illustrates an exemplary distributed system suitable for a distributed implementation of exemplary embodiments.

FIG. 16 illustrates an example distributed implementation of exemplary embodiments. System 1600 may include computer 1500, a network 1620, a service provider 1630, a target environment 1640, and a cluster 1650. The embodiment of FIG. 16 is exemplary, and other embodiments can include more devices, fewer devices, or devices in arrangements that differ from the arrangement of FIG. 16.

Network 1620 may transport data from a source to a destination. Embodiments of network 1620 may use network devices, such as routers, switches, firewalls, and/or servers (not shown) and connections (e.g., links) to transport data. 'Data,' as used herein, may refer to any type of machine-readable information having substantially any format that may be adapted for use in one or more networks and/or with one or more devices (e.g., computer 1500, service provider 1630, etc.). Data may include digital information or analog information. Data may further be packetized and/or non-packetized.

Network 1620 may be a hardwired network using wired conductors and/or optical fibers and/or may be a wireless network using free-space optical, radio frequency (RF), and/or acoustic transmission paths. In one implementation, network 1620 may be a substantially open public network, such as the Internet. In another implementation, network 1620 may be a more restricted network, such as a corporate virtual network. The network 1620 may include Internet, intranet, Local Area Network (LAN), Wide Area Network (WAN), Metropolitan Area Network (MAN), wireless network (e.g., using IEEE 802.11, Bluetooth, etc.), etc. The communication network 1620 may use middleware, such as Common Object Request Broker Architecture (CORBA) or Distributed Component Object Model (DCOM). Implementations of networks and/or devices operating on networks described herein are not limited to any particular data type, protocol, architecture/configuration, etc.

Service provider 1630 may include a device that makes a service available to another device. For example, service provider 1630 may include an entity (e.g., an individual, a corporation, an educational institution, a government agency, etc.) that provides one or more services to a destination using a server and/or other devices. Services may include instructions that are executed by a destination to perform an operation (e.g., an optimization operation). Alternatively, a service may include instructions that are executed on behalf of a destination to perform an operation on the destination's behalf.

Target environment 1640 may include a device that receives information over network 1620. For example, target environment 1640 may be a device that receives user input from computer 1500 for configuring execution of output and update operations for state enabled systems.

Cluster 1650 may include a number of units of execution (UEs) 1660 and may perform processing on behalf of computer 1500 and/or another device, such as service provider 1630. For example, in one embodiment, cluster 1650 may perform parallel processing on an operation received from computer 1500. Cluster 1650 may include UEs 1660 that reside on a single device or chip or that reside on a number of devices or chips.

Units of execution (UEs) 1660 may include processing devices that perform operations on behalf of a device, such as a requesting device. In one embodiment, a UE can be a microprocessor, field programmable gate array (FPGA), and/or another type of processing device. Embodiments of UE 1660 may include code, such as code for an operating environment. For example, a UE may run a portion of an operating environment that pertains to parallel processing activities.

Units of Execution (UEs) provide remote/distributed processing capabilities for our products, such as MATLAB®. A hardware unit of execution may include a device (e.g., a hardware resource) that performs and/or participates in parallel programming activities. For example, a hardware unit of execution may perform and/or participate in parallel programming activities in response to a request and/or a task it has received (e.g., received directly or via a proxy). A hardware unit of execution may perform and/or participate in substantially any type of parallel programming (e.g., task, data, stream processing, etc.) using one or more devices. For example, in one implementation, a hardware unit of execution may include a single processing device that includes multiple cores, and in another implementation, the hardware unit of execution may include a number of processors. A hardware unit of execution may also be a programmable device, such as a field programmable gate array (FPGA), an application specific integrated circuit (ASIC), a digital signal processor (DSP), etc. Devices used in a hardware unit of execution may be arranged in substantially any configuration (or topology), such as a grid, ring, star, etc. A hardware unit of execution may support one or more threads (or processes) when performing processing operations.

A software unit of execution may include a software resource (e.g., a technical computing environment, a worker, a lab, etc.) that performs and/or participates in parallel programming activities. For example, a software unit of execution may perform and/or participate in parallel programming activities in response to a receipt of a program and/or one or more portions of the program. A software unit of execution may perform and/or participate in substantially any type of parallel programming using one or more hardware units of execution. Embodiments of a software unit of execution may support one or more threads and/or processes when performing processing operations.

The term 'parallel programming' may be understood to include multiple types of parallel programming, e.g. task parallel programming, data parallel programming, and stream parallel programming. Parallel programming may include any type of processing that can be distributed across two or more resources (e.g., software units of execution, hardware units of execution, processors, microprocessors, clusters, labs, etc.) and be performed at substantially the same time. For example, in one implementation, parallel programming may refer to task parallel programming where a number of tasks are processed at substantially the same time on a number of software units of execution. In task parallel programming, each task may be processed independently of other tasks executing at the same time (e.g., a first software unit of execution executing a first task may not communicate with a second software unit of execution executing a second task). In another implementation, parallel programming may refer to data parallel programming, where data (e.g., a data set) is parsed into a number of portions that are executed in parallel using two or more software units of execution. In data parallel programming, the software units of execution and/or the data portions may communicate with each other as processing progresses. In still another implementation, parallel programming may refer to stream parallel programming (also referred to as pipeline parallel programming). Stream parallel programming may use a number of software units of execution arranged in series (e.g., a line) where a first software unit of execution produces a first result that is fed to a second software unit of execution that produces a second result. Stream parallel programming may also include a state where task allocation may be expressed in a directed acyclic graph (DAG) or a cyclic graph with delays). Other implementations may combine two or more of task, data, or stream parallel programming techniques alone or with other types of processing techniques to form hybrid-parallel programming techniques.

XII. Conclusion

Implementations may provide devices and techniques for state enabled systems in a graphical environment that may be configured to control execution of one or more operations associated with the state enabled systems. For example, in an embodiment referred to as a 'state enabled system,' a state enabled system may be configured so that output operations are executed independent of whether the state enabled system is 'active' or enabled,' while update operations are executed only when the state enabled system is 'active' or 'enabled.'

The foregoing description of exemplary embodiments of the invention provides illustration and description, but is not intended to be exhaustive or to limit the invention to the precise form disclosed. Modifications and variations are possible in light of the above teachings or may be acquired from practice of the invention. For example, while a series of acts has been described with regard to FIGS. 12 and 13, the order of the acts may be modified in other implementations consistent with the principles of the invention. Further, non-dependent acts may be performed in parallel.

In addition, implementations consistent with principles of the invention can be implemented using devices and configurations other than those illustrated in the figures and described in the specification without departing from the spirit of the invention. Devices and/or components may be added and/or removed from the implementations of the figures depending on specific deployments and/or applications. Also, disclosed implementations may not be limited to any specific combination of hardware.

Furthermore, certain portions of the invention may be implemented as 'logic' that performs one or more functions. This logic may include hardware, such as hardwired logic, an application-specific integrated circuit, a field programmable gate array, a microprocessor, software, or a combination of hardware and software.

No element, act, or instruction used in the description of the invention should be construed as critical or essential to the invention unless explicitly described as such. Also, as used herein, the article 'a' is intended to include one or more items. Where only one item is intended, the term 'one' or similar language is used. Further, the phrase 'based on,' as used herein is intended to mean 'based, at least in part, on' unless explicitly stated otherwise.

The scope of the invention is defined by the claims and their equivalents.

We claim:

1. One or more non-transitory computer-readable media storing instructions, the instructions comprising:
 a plurality of instructions which, when executed by a computing device, cause the computing device to:
  identify a block in an executable model,
   a first operation and a second operation being executed during execution of the block,
    the first operation generating an output for the block when the first operation is executed, and
    the second operation updating a state of the block when the second operation is executed;
  identify a condition that enables execution of one or more operations associated with the block,
   the one or more operations being prevented from being executed when the condition is not satisfied,
   the one or more operations including the second operation;
  configure the block to cause the second operation to be executed when the condition is satisfied,
   the second condition being prevented from being executed when the condition is not satisfied,
   the first operation being executed independent of the condition being satisfied;
  determine whether the condition is satisfied;

cause the first operation to be executed to generate the output when the condition is satisfied and when the condition is not satisfied; and
cause the second operation to be executed to update the state of the block when the condition is satisfied, the second operation being prevented from being executed to update the state of the block when the condition is not satisfied.

2. The one or more media of claim 1, where the instructions further comprise:
one or more instructions to render a visual identifier associated with the block to identify that the second operation is to be executed when the condition is satisfied.

3. The one or more media of claim 1, where the executable model is a graphical model or a graphical program.

4. The one or more media of claim 1, where the executable model is a block diagram model.

5. The one or more media of claim 1, where the executable model is a data flow diagram.

6. The one or more media of claim 1, where the instructions further comprise:
one or more instructions to provide, for display, a user interface for configuring the block; and
one or more instructions to receive, via the user interface, information relating to execution of the first operation and the second operation.

7. The one or more media of claim 1, where a third operation is executed during the execution of the block, and where the instructions further comprise:
one or more instructions to configure the block to prevent execution of the third operation when a second condition is not satisfied.

8. A method comprising:
identifying, using a computing device, a block in an executable model,
a first operation and a second operation being executed during execution of the block,
the first operation generating an output for the block when the first operation is executed, and
the second operation updating a state of the block when the second operation is executed;
identifying, by the computing device, a condition that enables execution of one or more operations associated with the block,
the one or more operations being prevented from being executed when the condition is not satisfied,
configuring, by the computing device, the block to cause the second operation to be executed when the condition is satisfied,
the second operation being prevented from being executed when the condition is not satisfied,
the first operation executing independent of the condition being satisfied;
determining, by the computing device, whether the condition is satisfied;
causing, using the computing device, the first operation to be executed to generate the output when the condition is satisfied and when the condition is not satisfied; and
causing, using the computing device, the second operation to be executed to update the state of the block model when the condition is satisfied,
the second operation being prevented from being executed to update the state of the block when the condition is not satisfied.

9. The method of claim 8, further comprising:
providing for display, using the computing device, a visual identifier associated with the block to identify that the second operation is to be executed when the condition is satisfied.

10. The method of claim 8, further comprising:
providing for display, using the computing device, a user interface for configuring the block; and
receiving, via the user interface, information relating to execution of the first operation and the second operation.

11. The method of claim 8, where the block is associated with a third operation, and
where the method further comprises:
configuring, using the computing device, the block to prevent execution of the third operation when a second condition is not satisfied.

12. The method of claim 8, where the executable model is a graphical model or a graphical program.

13. A computer system comprising:
a memory; and
a processor to:
provide a block in an executable model,
a first operation and a second operation being executed during execution of the block,
the first operation generating an output for the block when the first operation is executed, and
the second operation updating a state of the block when the second operation is executed,
identify a condition that enables execution of one or more operations associated with the block,
the one or more operations being prevented from being executed when the condition is not satisfied,
configure the block to cause the second operation to be executed when a condition is satisfied,
the second operation being prevented from being executed when the condition is not satisfied,
the first operation executing independent of the condition being satisfied, determine whether the condition is satisfied,
cause the first operation to be executed to generate the output when the condition is satisfied and when the condition is not satisfied, and
cause the second operation to be executed to update the state of the block when the condition is satisfied,
the second operation being prevented from being executed to update the state of the block when the condition is not satisfied.

14. The system of claim 13, where the processor is further to:
provide, for display, a visual identifier associated with the block to identify that the second operation is to be executed when the condition is satisfied.

15. The system of claim 13, where the executable model is a graphical model or a graphical program.

16. The system of claim 13, where, when providing the block, the processor is to provide the block for display on a display device.

17. A device comprising:
a memory; and
one or more processors to:
identify an element in an executable model,
a first operation and a second operation being executed during execution of the element,
the first operation generating an output for the element when the first operation is executed, and
the second operation updating a state of the element when the second operation is executed, identify a condition relating to the element,
  the condition preventing one or more operations, associated with the element, from being executed when the condition is not satisfied,
  the one or more operations including the second operation;
configure the element to cause the second operation to be executed when the condition is satisfied,
  the second operation being prevented from being executed when the condition is not satisfied,
configure the element to cause the first operation to be executed independent of the condition being satisfied,
determine whether the condition is satisfied,
cause the first operation to be executed to generate the output when the condition is satisfied and when the condition is not satisfied, and
cause the second operation to be executed to update the state of the element when the condition is satisfied,
  the second operation being prevented from being executed to update the state of the element when the condition is not satisfied.

18. The device of claim 17, where the element is associated with a third operation, and
  where the one or more processors are further to:
    configure the element to prevent execution of the third operation when the condition is not satisfied.

19. The device of claim 17, where the executable model is a graphical model, a data flow diagram, a state chart, or a graphical program, and
  where the one or more processors are further to:
    detect that a signal is received at a port of the element, and
    determine that the condition is satisfied based on detecting that the signal is received at the port.

* * * * *